(12) United States Patent  
Ni Chleirigh et al.

(10) Patent No.: US 9,134,526 B2  
(45) Date of Patent: Sep. 15, 2015

(54) DISPLAY DEVICE INCORPORATING MULTIPLE DIELECTRIC LAYERS

(71) Applicant: Pixtronix, Inc., San Diego, CA (US)

(72) Inventors: Cait Ni Chleirigh, Arlington, MA (US); Susan Oakley, Oxford, MA (US); Aleksander Franz, Winchester, MA (US); Joyce H. Wu, Somerville, MA (US)

(73) Assignee: Pixtronix, Inc., San Diego, CA (US)

( * ) Notice: Subject to any disclaimer, the term of this patent is extended or adjusted under 35 U.S.C. 154(b) by 517 days.

(21) Appl. No.: 13/719,648

(22) Filed: Dec. 19, 2012

(65) Prior Publication Data

US 2014/0168224 A1     Jun. 19, 2014

(51) Int. Cl.
| | |
|---|---|
| *G02B 26/00* | (2006.01) |
| *G06F 15/00* | (2006.01) |
| *C23C 16/40* | (2006.01) |
| *G02B 26/02* | (2006.01) |
| *C23C 16/455* | (2006.01) |
| *B81B 3/00* | (2006.01) |

(52) U.S. Cl.
CPC .............. *G02B 26/00* (2013.01); *B81B 3/0008* (2013.01); *C23C 16/40* (2013.01); *C23C 16/45525* (2013.01); *G02B 26/02* (2013.01); *G06F 15/00* (2013.01); *Y10T 29/49002* (2015.01)

(58) Field of Classification Search
CPC ........ G02B 26/00; G02B 26/02; G06F 15/00; C23C 16/40; C23C 16/45525; B81B 3/0008; Y10T 29/49002
See application file for complete search history.

(56) References Cited

U.S. PATENT DOCUMENTS

| 5,665,658 A | 9/1997 | Passlack |
|---|---|---|
| 7,233,029 B2 | 6/2007 | Mochizuki |
| 7,535,621 B2 | 5/2009 | Chiang |
| 8,003,422 B2 | 8/2011 | Lee et al. |
| 8,022,599 B2 | 9/2011 | Kawakubo et al. |
| 8,164,815 B2 | 4/2012 | Londergan et al. |
| 2010/0110518 A1 | 5/2010 | Wu et al. |

OTHER PUBLICATIONS

NPL International Preliminary Report on Patentability (IB/373) Chapter II prepared for PCT/US2013/075299 on Jun. 20, 2015.*
Herrmann C. F. et al., "Properties of atomic-layer-deposited A1203/ZnO dielectric films grown at low temperature for RF MEMS", Proceedings of SPIE, Jan. 22, 2005, vol. 5715, pp. 159-166, XP055103117, ISSN: 0277-786X, DOI: 10.1117/12.589322.
International Search Report and Written Opinion—PCT/US2013/075299—ISA/EPO—Mar. 18, 2014.

(Continued)

*Primary Examiner* — David N Spector
(74) *Attorney, Agent, or Firm* — Edward A. Gordon; Foley & Lardner LLP

(57) ABSTRACT

This disclosure provides systems, methods and apparatus for providing multiple dielectric coatings for a shutter assembly. The multiple dielectric coatings include an outer dielectric coating and one or more inner dielectric coatings. The outer dielectric coating has an electrical trap density that is lower than electrical trap densities of the one or more inner dielectric coatings. The lower electrical trap density reduces the amount of charge buildup over various surfaces of the shutter assembly. This reduction in charge buildup also reduces electrostatic forces that may cause incorrect operation of the shutter assembly.

29 Claims, 22 Drawing Sheets

(56) References Cited

OTHER PUBLICATIONS

Wibbeler J. et al., "Parasitic charging of dielectric surfaces in capacitive microelectromechanical systems (MEMS)", Sensors and Actuators A, Nov. 1, 1998, Elsevier Sequoia S.A., Lausanne, vol. 71, No. 1-2, pp. 74-80, XP004140077, ISSN: 0924-4247, DOI: 10.1016/S0924-4247(98)00155-1.

Yamazaki et al., "An intelligent bipolar actuation method with high stiction immunity for RF MEMS capacitive switches and variable capacitors", Sensors and Actuators A, Aug. 29, 2007, Elsevier Sequoia S.A., Lausanne, CH, vol. 139, No. 1-2, pp. 233-236, XP022216743, ISSN: 0924-4247, DOI: 10.1016/J.SNA.2007.03.014.

* cited by examiner

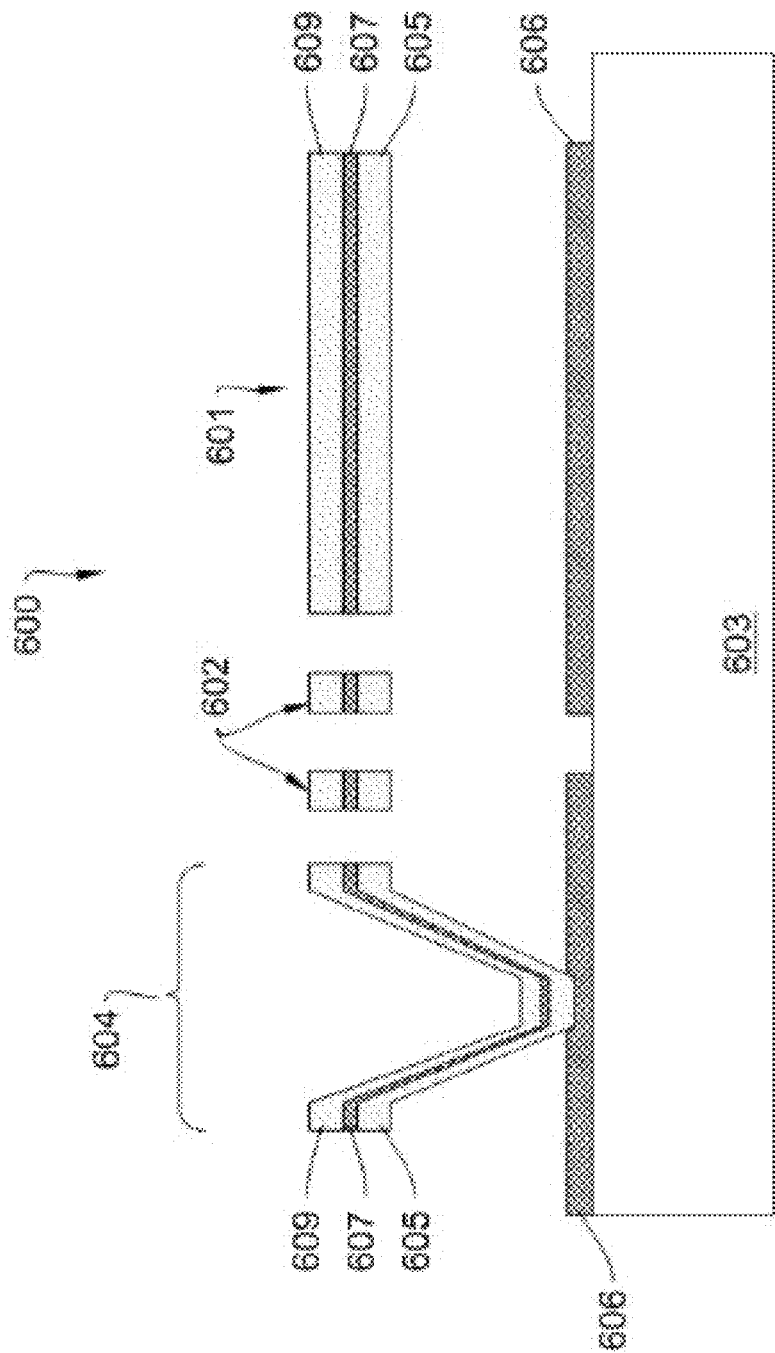

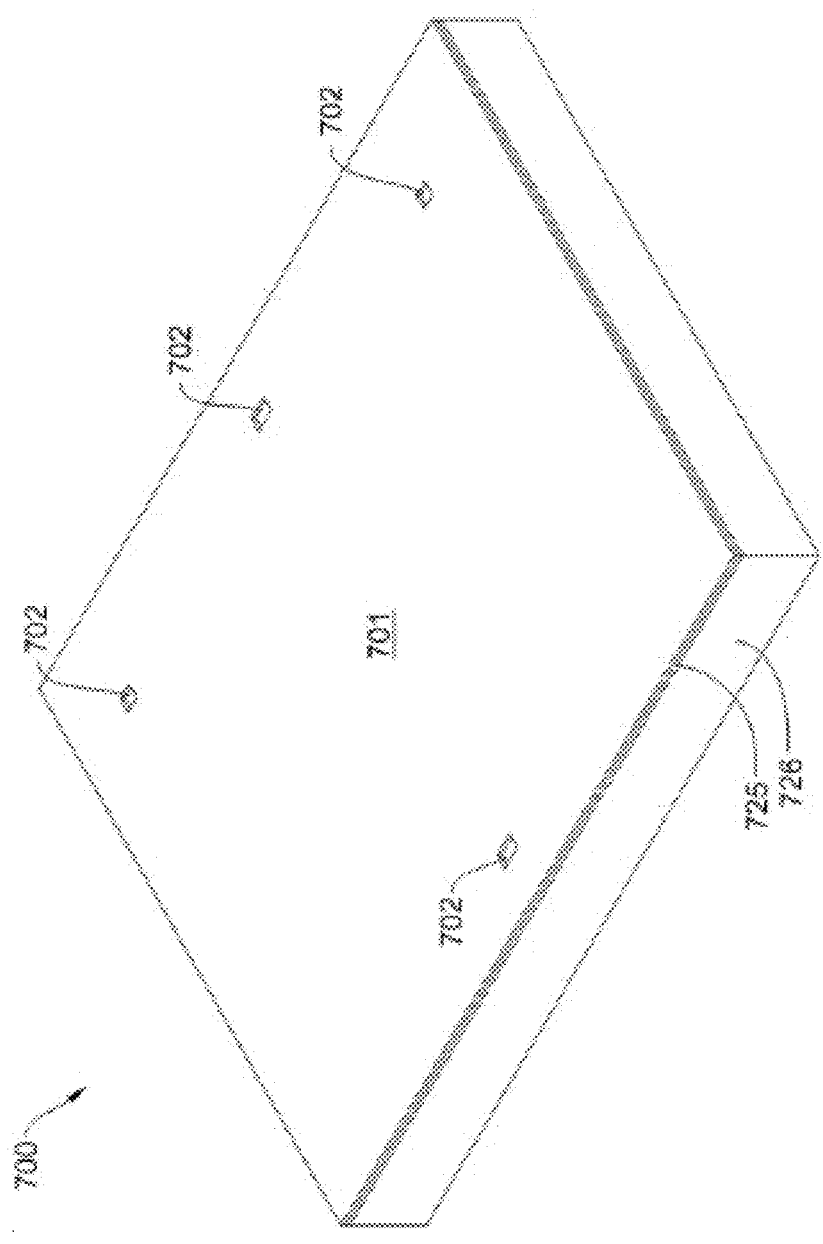

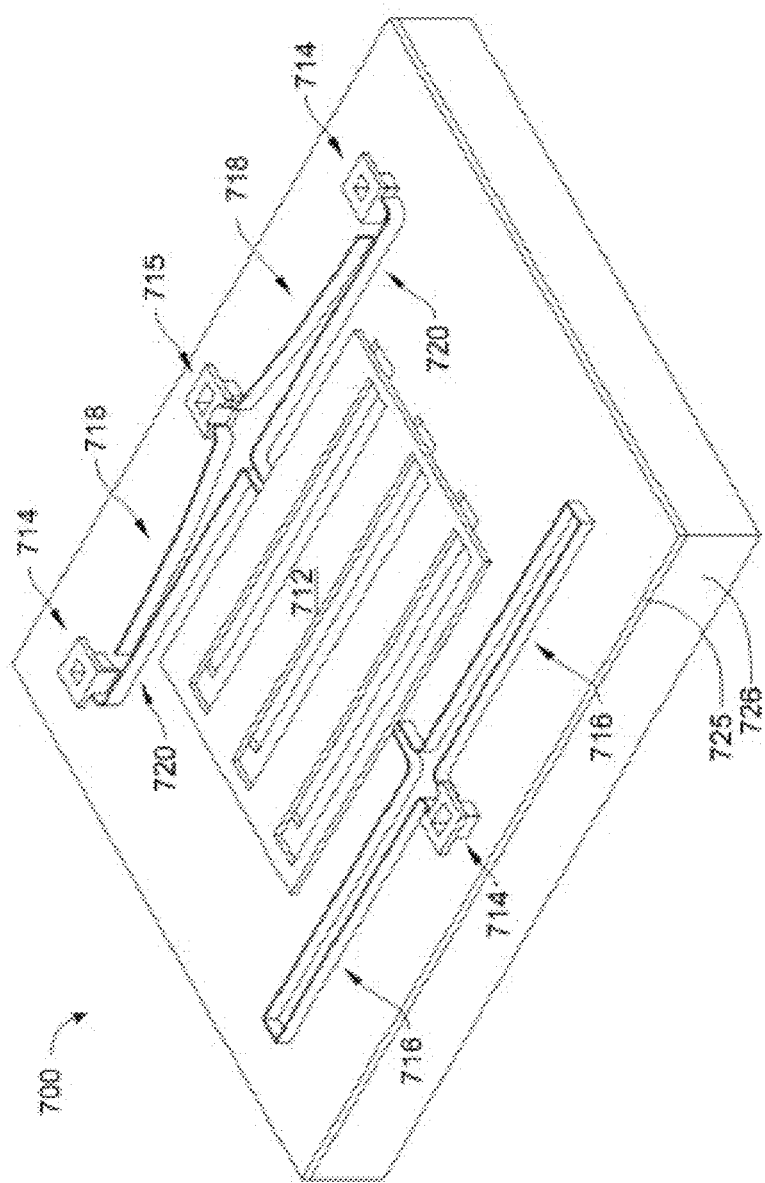

DISPLAY DEVICE INCORPORATING MULTIPLE DIELECTRIC LAYERS

TECHNICAL FIELD

This disclosure relates to electromechanical systems (EMS). In particular, this disclosure relates to EMS display devices having multiple dielectric layers.

DESCRIPTION OF THE RELATED TECHNOLOGY

Display devices can include an array of electromechanical systems (EMS) shutter assemblies for moving a shutter between open and closed positions over an aperture formed in an aperture plate. A backlight for providing light is placed behind the aperture plate, such that when the shutters are in the open position, the shutters allow propagation of light through the aperture towards a front of the display device. During a typical manufacturing process, the shutter assembly and the aperture plate are coated with a passivation layer (e.g., a dielectric layer) to protect them from subsequent manufacturing steps such as packaging. The passivation layer also provides insulation of several conductive portions of the shutter assembly. The shutter assemblies, including their respective shutters and shutter actuating elements, are immersed within a fluid to lubricate the movement of the shutter and to reduce the likelihood of stiction. The fluid also improves the display device's optical performance.

During manufacture or operation of the display device, electrical charges can accumulate over various surfaces of the display device. In particular, the electrical charges may accumulate non-uniformly on the surface of the passivation layer deposited on the shutter and the aperture plate. Furthermore, asymmetrical driving of the shutter/electrodes due to algorithm/circuit requirements may result in a difference in charge build up on one or more portions of the shutter actuating elements. That is, more charge may build up on one surface of the shutter actuating elements than on the other. The non-uniform accumulation of charges may result in electrostatic forces being exerted on the shutter. This may introduce defects in the operation of the display device ranging from slowing the speed of actuation of the shutter to the shutter being temporarily or permanently stuck in an open or closed position, or being stuck to the aperture plate.

SUMMARY

The systems, methods and devices of the disclosure each have several innovative aspects, no single one of which is solely responsible for the desirable attributes disclosed herein.

One innovative aspect of the subject matter described in this disclosure can be implemented in an apparatus having a light blocking layer, defining a plurality of openings for passing light, disposed on a substrate. The apparatus also includes at least one light modulator, responsive to image data, configured to modulate light propagating through at least one of the plurality of openings, a first dielectric layer disposed over at least a portion of the light blocking layer and over surfaces of at least one light modulator that are substantially parallel to the substrate and over surfaces of at least one light modulator that are substantially normal to the substrate, and a second dielectric layer, having an electrical trap density that is lower than that of the first dielectric layer, disposed directly and substantially conformally over the first dielectric layer.

In some implementations, the first dielectric layer is thicker than the second dielectric layer. In some implementations, the first dielectric layer includes a chemical vapor-deposited material and the second dielectric layer includes an atomic layer-deposited material. In some implementations, the apparatus includes a fluid in which at least one light modulator is immersed, such that the fluid is in contact with the second dielectric layer.

In some implementations, the apparatus also includes a cover plate for transmitting a modulated light received from at least one light modulator to a front side of the apparatus, where the second dielectric layer is additionally disposed over a portion of the cover plate facing at least one light modulator. In some other implementations, the apparatus includes a cover plate for transmitting a modulated light received from at least one light modulator to a front side of the apparatus, where the first dielectric layer and the second dielectric layer are disposed over a portion of the cover plate facing the at least one light modulator.

In some implementations, a thickness of the first dielectric layer is within a range of about 10 nm to about 300 nm In some implementations, a thickness of the second dielectric layer is within a range of about 1 nm to about 100 nm.

In some implementations, the apparatus also includes a display having the light blocking layer and the at least one light modulator, a processor that is configured to communicate with the display, the processor being configured to process image data, and a memory device that is configured to communicate with the processor. In some implementations, the display further includes a driver circuit configured to send at least one signal to the display, and a controller configured to send at least a portion of the image data to the driver circuit. In some other implementations, the display further includes an image source module configured to send the image data to the processor, where the image source module comprises at least one of a receiver, transceiver, and transmitter. In some implementations, the display further includes an input device configured to receive input data and to communicate the input data to the processor.

Another innovative aspect of the subject matter described in this disclosure can be implemented in a method for forming a shutter assembly, the method including forming a shutter assembly on a substrate, the shutter assembly including a shutter and an actuator coupled to the shutter, depositing a first dielectric layer over the shutter assembly and the substrate, and depositing a second dielectric layer, having an electrical trap density that is lower that that of the first dielectric layer, substantially conformally over the first dielectric layer.

In some implementations, depositing the first dielectric layer includes depositing the first dielectric layer over surfaces of the shutter assembly that are substantially parallel to the substrate and over surfaces of the shutter assembly that are substantially normal to the substrate.

In some implementations, the method further includes depositing the first dielectric layer to a first thickness and depositing the second dielectric layer to a second thickness, where the first thickness is greater than the second thickness. In some implementations, the method further includes immersing the shutter assembly in a fluid, such that the fluid is in contact with the second dielectric layer.

In some implementations, the method further includes providing a cover plate configured for transmitting a modulated light allowed to pass by the shutter to a front of a display apparatus, and depositing the first dielectric layer over a portion of the cover plate configured to face the shutter assembly. In some such implementations, the method further includes depositing the second dielectric layer over the first dielectric layer that is deposited over the portion of the cover plate facing the shutter assembly.

In some implementations, forming the shutter assembly includes forming a mold on the substrate, forming the shutter assembly over the mold, and removing the mold thereby releasing the shutter assembly. In some such implementations, the method further includes depositing the first dielectric material and depositing the second dielectric material prior to removing the mold. In some other implementations, the method further includes depositing the first dielectric material and depositing the second dielectric material after removing the mold.

In some implementations, depositing the first dielectric layer includes forming a thickness of the first dielectric layer within a range of about 10 nm to about 300 nm. In some implementations, depositing the second dielectric layer includes forming a thickness of the second dielectric layer within a range of about 1 nm to about 100 nm.

In some implementations, depositing the first dielectric layer includes employing a chemical vapor deposition technique for depositing the first dielectric layer. In some implementations, depositing the second dielectric layer includes employing an atomic layer deposition technique for depositing the second dielectric layer.

Another innovative aspect of the subject matter described in this disclosure can be implemented in an apparatus having light blocking means, disposed on a substrate, for defining a plurality of openings for passing light. The apparatus further includes light modulating means, responsive to image data, for modulating light propagating through at least one of the plurality of openings, first dielectric means disposed over at least a portion of the light blocking means and over surfaces of the light modulating means for providing a first layer of insulation, and second dielectric means disposed substantially conformally over the first dielectric means for providing a second layer of insulation, where an electric trap density of the second dielectric means is less than that of the first dielectric means. In some implementations, the second dielectric means is thicker than the first dielectric means.

In some implementations, the apparatus also includes lubricating means for facilitating movement of the light modulating means, where the lubricating means is in contact with the second dielectric means. In some implementations, the apparatus also includes covering means for passing modulated light received from the light modulator means, where the second dielectric means is additionally disposed over a portion of the covering means facing the light modulating means.

Details of one or more implementations of the subject matter described in this specification are set forth in the accompanying drawings and the description below. Although the examples provided in this summary are primarily described in terms of MEMS-based displays, the concepts provided herein may apply to other types of displays, such as liquid crystal displays (LCD), organic light emitting diode (OLED) displays, electrophoretic displays, and field emission displays, as well as to other non-display MEMS devices, such as MEMS microphones, sensors, and optical switches. Other features, aspects, and advantages will become apparent from the description, the drawings, and the claims. Note that the relative dimensions of the following figures may not be drawn to scale.

BRIEF DESCRIPTION OF THE DRAWINGS

FIGS. 6A-6E show cross sectional views of stages of construction of an example composite shutter assembly.

FIGS. 7A-7D show isomeric views of stages of construction of an example shutter assembly with narrow sidewall beams.

Like reference numbers and designations in the various drawings indicate like elements.

DETAILED DESCRIPTION

Figure 1A:
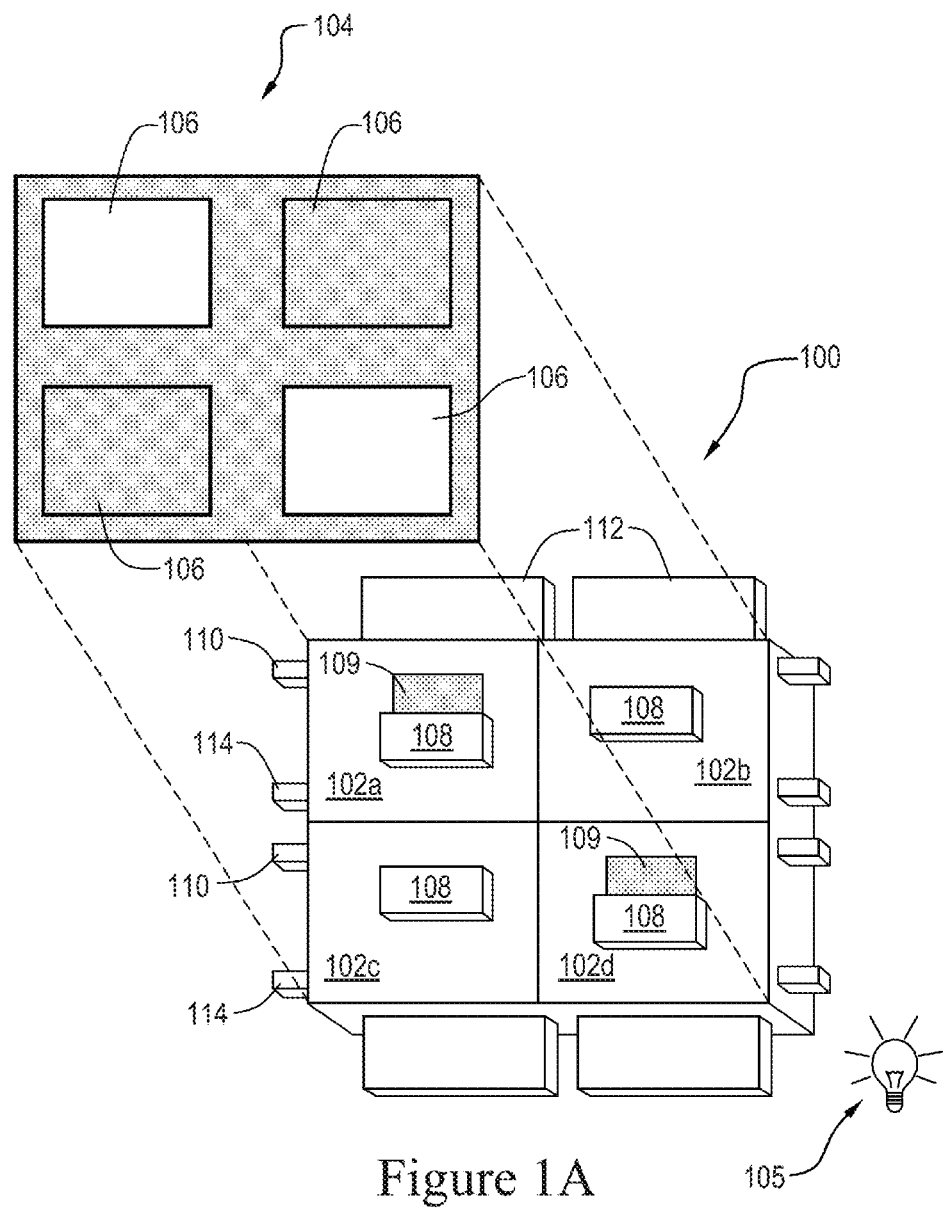
FIG. 1A shows an example schematic diagram of a direct-view MEMS-based display apparatus.

The following description is directed to certain implementations for the purposes of describing the innovative aspects of this disclosure. However, a person having ordinary skill in the art will readily recognize that the teachings herein can be applied in a multitude of different ways. The described implementations may be implemented in any device, apparatus, or system that can be configured to display an image, whether in motion (such as video) or stationary (such as still images), and whether textual, graphical or pictorial. More particularly, it is contemplated that the described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, global positioning system (GPS) receivers/navigators, cameras, digital media players (such as MP3 players), camcorders, game consoles, wrist watches, clocks, calculators, television monitors, flat panel displays, electronic reading devices (such as e-readers), computer monitors, auto displays (including odometer and speedometer displays, etc.), cockpit controls and/or displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS) applications including microelectromechanical systems (MEMS) applications, as well as non-EMS applications), aesthetic structures (such as display of images on a piece of jewelry or clothing) and a variety of EMS devices. The teachings herein also can be used in non-display applications such as, but not limited to, electronic switching devices, radio frequency filters, sensors, accelerometers, gyroscopes, motion-sensing devices, magnetometers, inertial components for consumer electronics, parts of consumer electronics products, varactors, liquid crystal devices, electrophoretic devices, drive schemes, manufacturing processes and electronic test equipment. Thus, the teachings are not intended to be limited to the implementations depicted solely in the Figures, but instead have wide applicability as will be readily apparent to one having ordinary skill in the art.

A display apparatus can include a plurality of electromechanical systems (EMS) devices, responsive to image data, for rendering images. EMS devices may include nanoelectromechanical systems (NEMS), microelectromechanical systems (MEMS) or larger scale electromechanical systems devices. The display apparatus can employ an EMS shutter assembly, formed over a substrate, that includes a shutter and an actuator coupled to the shutter. Undesired non-uniform accumulation of electric charges on a passivation layer deposited over the shutter assembly and the substrate can be reduced by depositing multiple dielectric layers over the shutter assembly and the substrate.

In some implementations, these dielectric layers include an outer dielectric layer and an inner dielectric layer. The inner dielectric layer can be deposited directly on the shutter assembly and the substrate, and the outer dielectric layer is deposited over the inner dielectric layer. The outer dielectric layer can have a lower electrical trap density than that of the inner dielectric layer. The outer dielectric layer also has a higher surface conformality than that of the inner dielectric layer. The outer dielectric layer can be in contact with the fluid in which the shutter is immersed. The lower electrical trap density of the outer dielectric layer reduces the charge buildup over the shutter assembly and the substrate. The decreased charge buildup decreases the magnitude of electrostatic forces that may occur between the shutter and the substrate. Because the magnitude of the electrostatic forces exerted on the shutter (in addition to various other components of the shutter assembly) is reduced, the risk of undesired operation of the shutter is also reduced. In some implementations, the multiple dielectric layers can include more than two dielectric layers. In such implementations, the multiple dielectric layers are deposited such that the outermost dielectric layer achieves the desired conformality and the desired electrical trap density.

In some implementations, the thickness of the outer dielectric layer is less than the thickness of the inner dielectric layer. In some implementations, the cover plate is also deposited with one or more dielectric layers for reducing charge buildup. These dielectric layers on the cover plate may be similar to those deposited on the shutter assembly and the substrate.

Particular implementations of the subject matter described in this disclosure can be implemented to realize one or more of the following potential advantages. The deposition of multiple dielectric layers over the shutter assembly and the substrate reduces the charge buildup and undesired electrostatic forces on the shutter assembly. Specifically, the outer dielectric layer, which has a lower electrical trap density, is configured to be in contact with the fluid in which the shutter assembly is immersed. Due to the lower electrical trap density of the outer dielectric layer, the charge buildup over various portions of the shutter assembly is reduced.

In some implementations, the multiple dielectric layers are also deposited over a cover plate that opposes the substrate and is proximal to the shutter assembly. Thus, charge buildup is also reduced over the cover plate. This further reduces the undesired electrostatic forces between the shutter assembly and the cover plate.

As the one or more inner dielectric layers are not in contact with the fluid, they can be formed from lower cost materials and deposition techniques. As such, the inner dielectric layers can be made thicker to provide the specified dielectric breakdown strengths for the shutter assembly.

FIG. 1A shows a schematic diagram of a direct-view MEMS-based display apparatus 100. The display apparatus 100 includes a plurality of light modulators 102a-102d (generally "light modulators 102") arranged in rows and columns. In the display apparatus 100, the light modulators 102a and 102d are in the open state, allowing light to pass. The light modulators 102b and 102c are in the closed state, obstructing the passage of light. By selectively setting the states of the light modulators 102a-102d, the display apparatus 100 can be utilized to form an image 104 for a backlit display, if illuminated by a lamp or lamps 105. In another implementation, the apparatus 100 may form an image by reflection of ambient light originating from the front of the apparatus. In another implementation, the apparatus 100 may form an image by reflection of light from a lamp or lamps positioned in the front of the display, i.e., by use of a front light.

In some implementations, each light modulator 102 corresponds to a pixel 106 in the image 104. In some other implementations, the display apparatus 100 may utilize a plurality of light modulators to form a pixel 106 in the image 104. For example, the display apparatus 100 may include three color-specific light modulators 102. By selectively opening one or more of the color-specific light modulators 102 corresponding to a particular pixel 106, the display apparatus 100 can generate a color pixel 106 in the image 104. In another example, the display apparatus 100 includes two or more light modulators 102 per pixel 106 to provide luminance level in an image 104. With respect to an image, a "pixel" corresponds to the smallest picture element defined by the resolution of image. With respect to structural components of the display apparatus 100, the term "pixel" refers to the combined mechanical and electrical components utilized to modulate the light that forms a single pixel of the image.

The display apparatus 100 is a direct-view display in that it may not include imaging optics typically found in projection applications. In a projection display, the image formed on the surface of the display apparatus is projected onto a screen or onto a wall. The display apparatus is substantially smaller than the projected image. In a direct view display, the user sees the image by looking directly at the display apparatus, which contains the light modulators and optionally a backlight or front light for enhancing brightness and/or contrast seen on the display.

Direct-view displays may operate in either a transmissive or reflective mode. In a transmissive display, the light modulators filter or selectively block light which originates from a lamp or lamps positioned behind the display. The light from the lamps is optionally injected into a lightguide or "backlight" so that each pixel can be uniformly illuminated. Transmissive direct-view displays are often built onto transparent or glass substrates to facilitate a sandwich assembly arrangement where one substrate, containing the light modulators, is positioned directly on top of the backlight.

Each light modulator 102 can include a shutter 108 and an aperture 109. To illuminate a pixel 106 in the image 104, the shutter 108 is positioned such that it allows light to pass through the aperture 109 towards a viewer. To keep a pixel 106 unlit, the shutter 108 is positioned such that it obstructs the passage of light through the aperture 109. The aperture 109 is defined by an opening patterned through a reflective or light-absorbing material in each light modulator 102.

The display apparatus also includes a control matrix connected to the substrate and to the light modulators for controlling the movement of the shutters. The control matrix includes a series of electrical interconnects (e.g., interconnects 110, 112 and 114), including at least one write-enable interconnect 110 (also referred to as a "scan-line interconnect") per row of pixels, one data interconnect 112 for each column of pixels, and one common interconnect 114 providing a common voltage to all pixels, or at least to pixels from both multiple columns and multiples rows in the display apparatus 100. In response to the application of an appropriate voltage (the "write-enabling voltage, VWE"), the write-enable interconnect 110 for a given row of pixels prepares the pixels in the row to accept new shutter movement instructions. The data interconnects 112 communicate the new movement instructions in the form of data voltage pulses. The data voltage pulses applied to the data interconnects 112, in some implementations, directly contribute to an electrostatic movement of the shutters. In some other implementations, the data voltage pulses control switches, e.g., transistors or other non-linear circuit elements that control the application of separate actuation voltages, which are typically higher in magnitude than the data voltages, to the light modulators 102. The application of these actuation voltages then results in the electrostatic driven movement of the shutters 108.

Figure 1B:
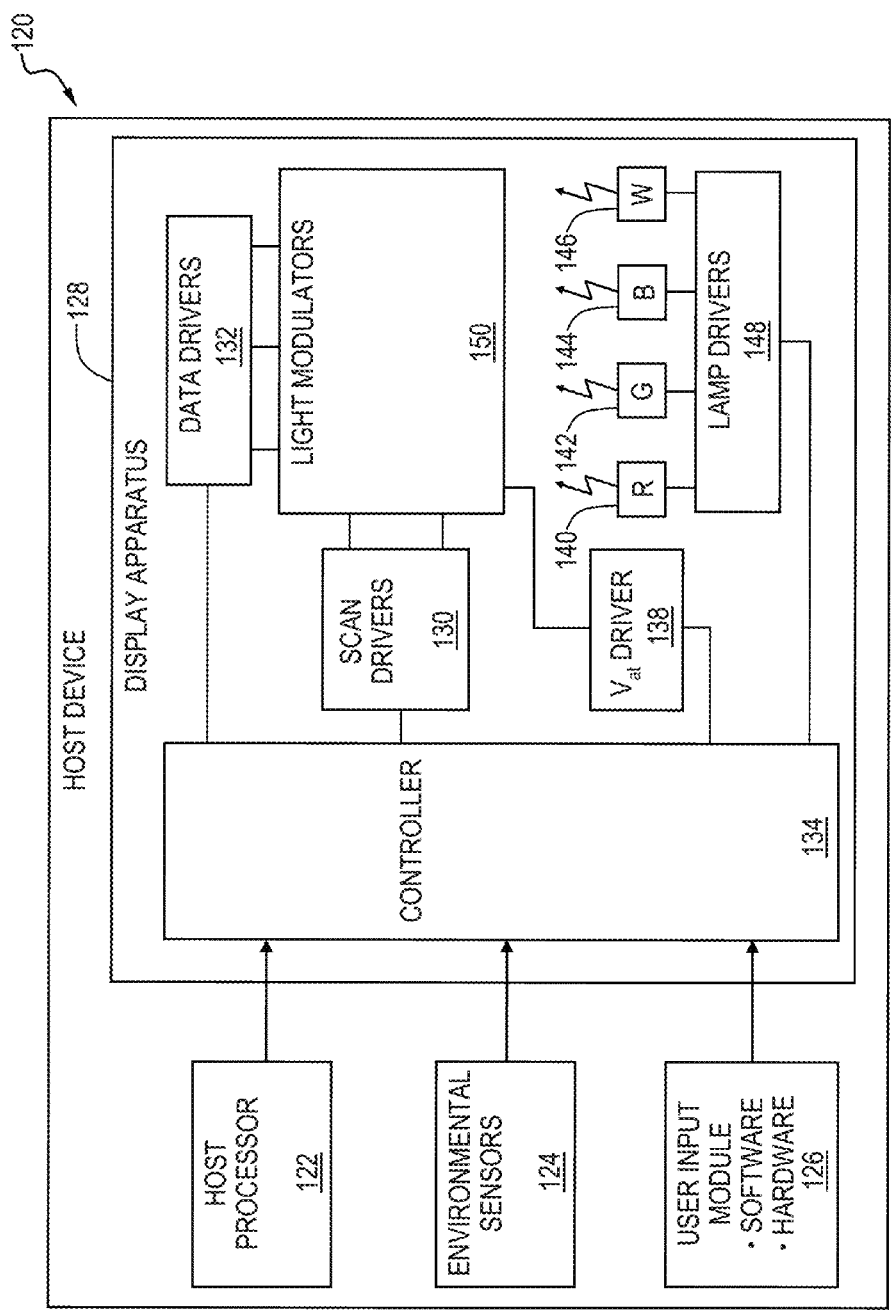
FIG. 1B shows an example block diagram of a host device.

FIG. 1B shows an example of a block diagram of a host device 120 (i.e., cell phone, smart phone, PDA, MP3 player, tablet, e-reader, netbook, notebook, etc.). The host device 120 includes a display apparatus 128, a host processor 122, environmental sensors 124, a user input module 126, and a power source.

The display apparatus 128 includes a plurality of scan drivers 130 (also referred to as "write enabling voltage sources"), a plurality of data drivers 132 (also referred to as "data voltage sources"), a controller 134, common drivers 138, lamps 140-146, lamp drivers 148 and an array 150 of display elements, such as the light modulators 102 shown in FIG. 1A. The scan drivers 130 apply write enabling voltages to scan-line interconnects 110. The data drivers 132 apply data voltages to the data interconnects 112.

In some implementations of the display apparatus, the data drivers 132 are configured to provide analog data voltages to the array 150 of display elements, especially where the luminance level of the image 104 is to be derived in analog fashion. In analog operation, the light modulators 102 are designed such that when a range of intermediate voltages is applied through the data interconnects 112, there results a range of intermediate open states in the shutters 108 and therefore a range of intermediate illumination states or luminance levels in the image 104. In other cases, the data drivers 132 are configured to apply only a reduced set of 2, 3 or 4 digital voltage levels to the data interconnects 112. These voltage levels are designed to set, in digital fashion, an open state, a closed state, or other discrete state to each of the shutters 108.

The scan drivers 130 and the data drivers 132 are connected to a digital controller circuit 134 (also referred to as the "controller 134"). The controller sends data to the data drivers 132 in a mostly serial fashion, organized in predetermined sequences grouped by rows and by image frames. The data drivers 132 can include series to parallel data converters, level shifting, and for some applications digital to analog voltage converters.

The display apparatus optionally includes a set of common drivers 138, also referred to as common voltage sources. In some implementations, the common drivers 138 provide a DC common potential to all display elements within the array 150 of display elements, for instance by supplying voltage to a series of common interconnects 114. In some other implementations, the common drivers 138, following commands from the controller 134, issue voltage pulses or signals to the array 150 of display elements, for instance global actuation pulses which are capable of driving and/or initiating simultaneous actuation of all display elements in multiple rows and columns of the array 150.

All of the drivers (e.g., scan drivers 130, data drivers 132 and common drivers 138) for different display functions are time-synchronized by the controller 134. Timing commands from the controller coordinate the illumination of red, green and blue and white lamps (140, 142, 144 and 146 respectively) via lamp drivers 148, the write-enabling and sequencing of specific rows within the array 150 of display elements, the output of voltages from the data drivers 132, and the output of voltages that provide for display element actuation. In some implementations, the lamps are light emitting diodes (LEDs).

The controller 134 determines the sequencing or addressing scheme by which each of the shutters 108 can be re-set to the illumination levels appropriate to a new image 104. New images 104 can be set at periodic intervals. For instance, for video displays, the color images 104 or frames of video are refreshed at frequencies ranging from 10 to 300 Hertz (Hz). In some implementations the setting of an image frame to the array 150 is synchronized with the illumination of the lamps 140, 142, 144 and 146 such that alternate image frames are illuminated with an alternating series of colors, such as red, green, and blue. The image frames for each respective color is referred to as a color subframe. In this method, referred to as the field sequential color method, if the color subframes are alternated at frequencies in excess of 20 Hz, the human brain will average the alternating frame images into the perception of an image having a broad and continuous range of colors. In alternate implementations, four or more lamps with primary colors can be employed in display apparatus 100, employing primaries other than red, green, and blue.

In some implementations, where the display apparatus 100 is designed for the digital switching of shutters 108 between open and closed states, the controller 134 forms an image by the method of time division gray scale, as previously described. In some other implementations, the display apparatus 100 can provide gray scale through the use of multiple shutters 108 per pixel.

In some implementations, the data for an image state 104 is loaded by the controller 134 to the display element array 150 by a sequential addressing of individual rows, also referred to as scan lines. For each row or scan line in the sequence, the scan driver 130 applies a write-enable voltage to the write enable interconnect 110 for that row of the array 150, and subsequently the data driver 132 supplies data voltages, corresponding to desired shutter states, for each column in the selected row. This process repeats until data has been loaded for all rows in the array 150. In some implementations, the sequence of selected rows for data loading is linear, proceeding from top to bottom in the array 150. In some other implementations, the sequence of selected rows is pseudo-randomized, in order to minimize visual artifacts. And in some other implementations the sequencing is organized by blocks, where, for a block, the data for only a certain fraction of the image state 104 is loaded to the array 150, for instance by addressing only every 5th row of the array 150 in sequence.

In some implementations, the process for loading image data to the array 150 is separated in time from the process of actuating the display elements in the array 150. In these implementations, the display element array 150 may include data memory elements for each display element in the array 150 and the control matrix may include a global actuation interconnect for carrying trigger signals, from common driver 138, to initiate simultaneous actuation of shutters 108 according to data stored in the memory elements.

In alternative implementations, the array 150 of display elements and the control matrix that controls the display elements may be arranged in configurations other than rectangular rows and columns. For example, the display elements can be arranged in hexagonal arrays or curvilinear rows and columns. In general, as used herein, the term scan-line shall refer to any plurality of display elements that share a write-enabling interconnect.

The host processor 122 generally controls the operations of the host. For example, the host processor 122 may be a general or special purpose processor for controlling a portable electronic device. With respect to the display apparatus 128, included within the host device 120, the host processor 122 outputs image data as well as additional data about the host. Such information may include data from environmental sensors, such as ambient light or temperature; information about the host, including, for example, an operating mode of the host or the amount of power remaining in the host's power source; information about the content of the image data; information about the type of image data; and/or instructions for display apparatus for use in selecting an imaging mode.

The user input module 126 conveys the personal preferences of the user to the controller 134, either directly, or via the host processor 122. In some implementations, the user input module 126 is controlled by software in which the user programs personal preferences such as "deeper color," "better contrast," "lower power," "increased brightness," "sports," "live action," or "animation." In some other implementations, these preferences are input to the host using hardware, such as a switch or dial. The plurality of data inputs to the controller 134 direct the controller to provide data to the various drivers 130, 132, 138 and 148 which correspond to optimal imaging characteristics.

An environmental sensor module 124 also can be included as part of the host device 120. The environmental sensor module 124 receives data about the ambient environment, such as temperature and or ambient lighting conditions. The sensor module 124 can be programmed to distinguish whether the device is operating in an indoor or office environment versus an outdoor environment in bright daylight versus an outdoor environment at nighttime. The sensor module 124 communicates this information to the display controller 134, so that the controller 134 can optimize the viewing conditions in response to the ambient environment.

Figure 2:
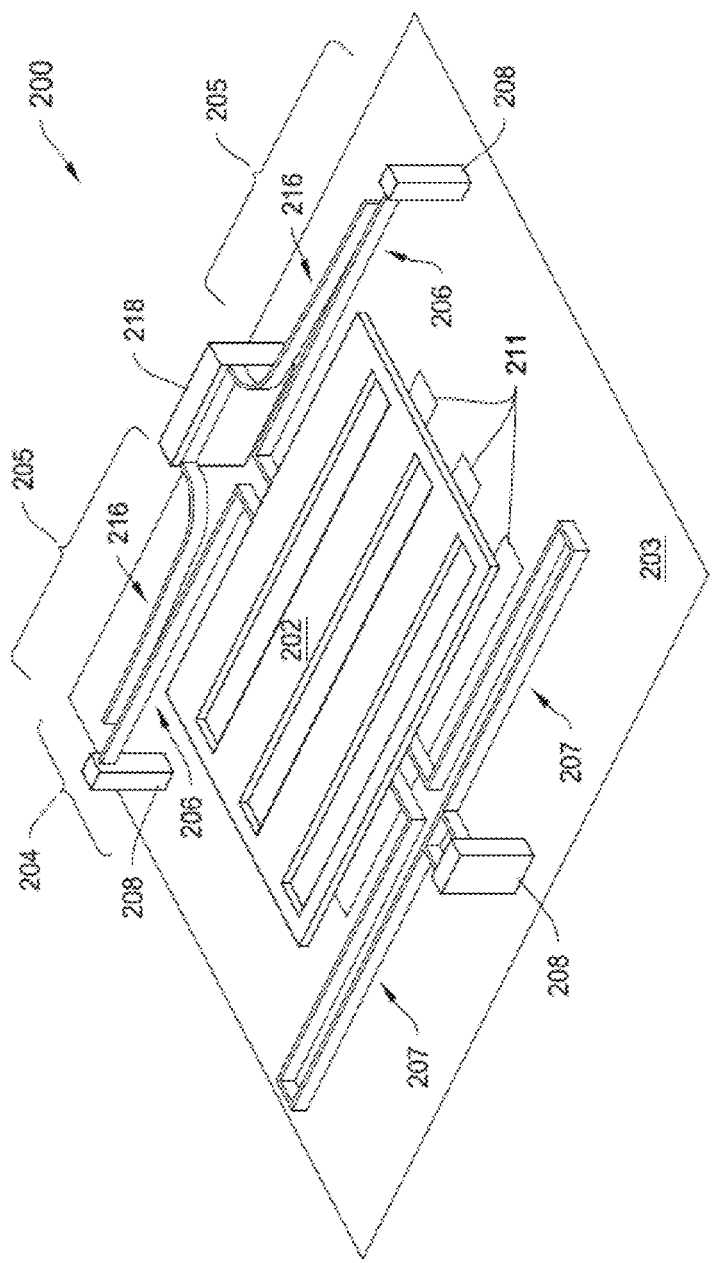
FIG. 2 shows an example perspective view of an illustrative shutter-based light modulator.

FIG. 2 shows a perspective view of an illustrative shutter-based light modulator 200. The shutter-based light modulator 200 is suitable for incorporation into the direct-view MEMS-based display apparatus 100 of FIG. 1A. The light modulator 200 includes a shutter 202 coupled to an actuator 204. The actuator 204 can be formed from two separate compliant electrode beam actuators 205 (the "actuators 205"). The shutter 202 couples on one side to the actuators 205. The actuators 205 move the shutter 202 transversely over a surface 203 in a plane of motion which is substantially parallel to the surface 203. The opposite side of the shutter 202 couples to a spring 207 which provides a restoring force opposing the forces exerted by the actuator 204.

Each actuator 205 includes a compliant load beam 206 connecting the shutter 202 to a load anchor 208. The load anchors 208 along with the compliant load beams 206 serve as mechanical supports, keeping the shutter 202 suspended proximate to the surface 203. The surface 203 includes one or more aperture holes 211 for admitting the passage of light. The load anchors 208 physically connect the compliant load beams 206 and the shutter 202 to the surface 203 and electrically connect the load beams 206 to a bias voltage, in some instances, ground.

If the substrate is opaque, such as silicon, then aperture holes 211 are formed in the substrate by etching an array of holes through the substrate. If the substrate is transparent, such as glass or plastic, then the aperture holes 211 are formed in a layer of light-blocking material deposited on the substrate. The aperture holes 211 can be generally circular, elliptical, polygonal, serpentine, or irregular in shape.

Each actuator 205 also includes a compliant drive beam 216 positioned adjacent to each load beam 206. The drive beams 216 couple at one end to a drive beam anchor 218 shared between the drive beams 216. The other end of each drive beam 216 is free to move. Each drive beam 216 is curved such that it is closest to the load beam 206 near the free end of the drive beam 216 and the anchored end of the load beam 206.

In operation, a display apparatus incorporating the light modulator 200 applies an electric potential to the drive beams 216 via the drive beam anchor 218. A second electric potential may be applied to the load beams 206. The resulting potential difference between the drive beams 216 and the load beams 206 pulls the free ends of the drive beams 216 towards the anchored ends of the load beams 206, and pulls the shutter ends of the load beams 206 toward the anchored ends of the drive beams 216, thereby driving the shutter 202 transversely toward the drive anchor 218. The compliant members 206 act as springs, such that when the voltage across the beams 206 and 216 potential is removed, the load beams 206 push the shutter 202 back into its initial position, releasing the stress stored in the load beams 206.

A light modulator, such as the light modulator 200, incorporates a passive restoring force, such as a spring, for returning a shutter to its rest position after voltages have been removed. Other shutter assemblies can incorporate a dual set of "open" and "closed" actuators and separate sets of "open" and "closed" electrodes for moving the shutter into either an open or a closed state.

There are a variety of methods by which an array of shutters and apertures can be controlled via a control matrix to produce images, in many cases moving images, with appropriate luminance levels. In some cases, control is accomplished by means of a passive matrix array of row and column interconnects connected to driver circuits on the periphery of the display. In other cases, it is appropriate to include switching and/or data storage elements within each pixel of the array (the so-called active matrix) to improve the speed, the luminance level and/or the power dissipation performance of the display.

Figure 3A:
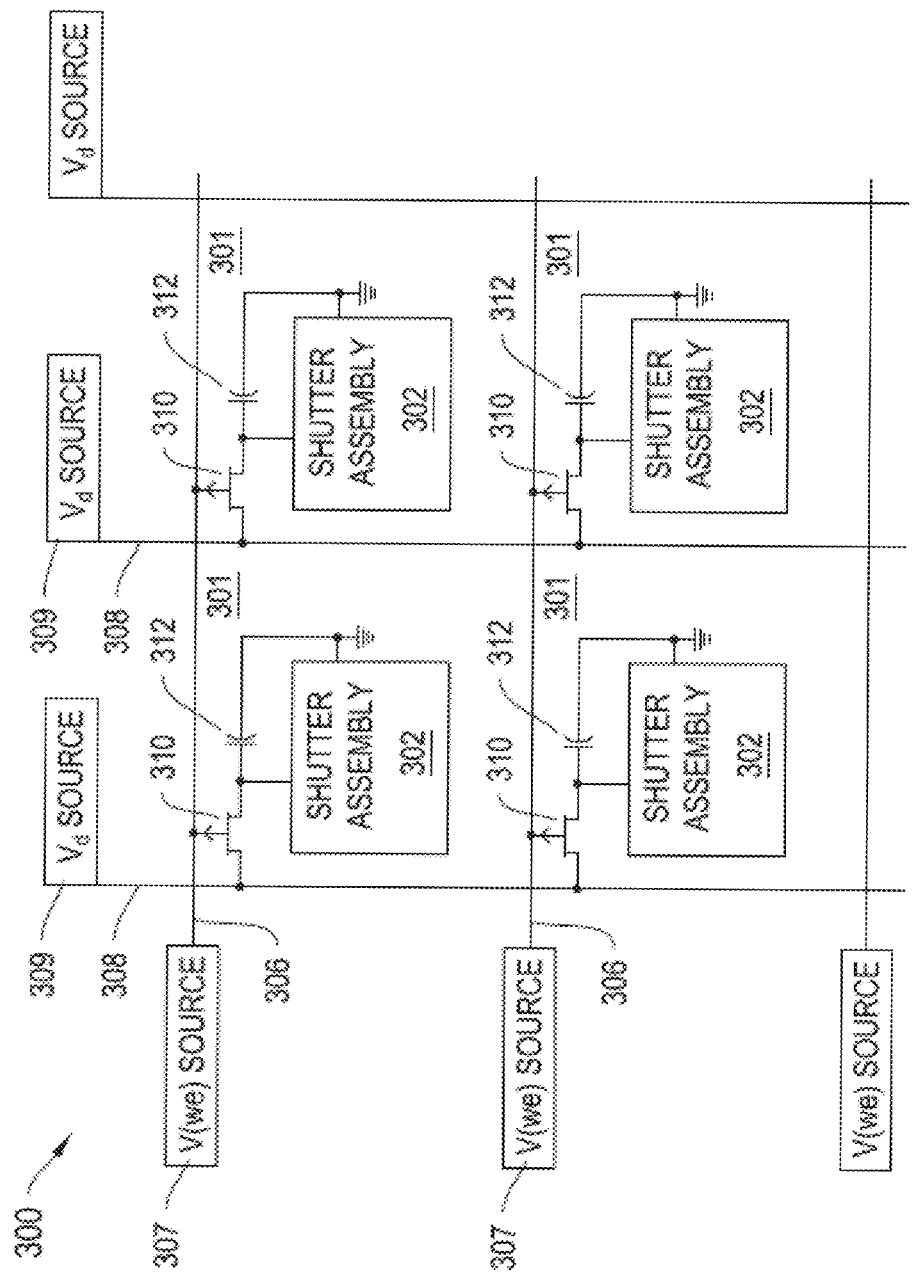
FIG. 3A shows an example schematic diagram of a control matrix.
Figure 3B:
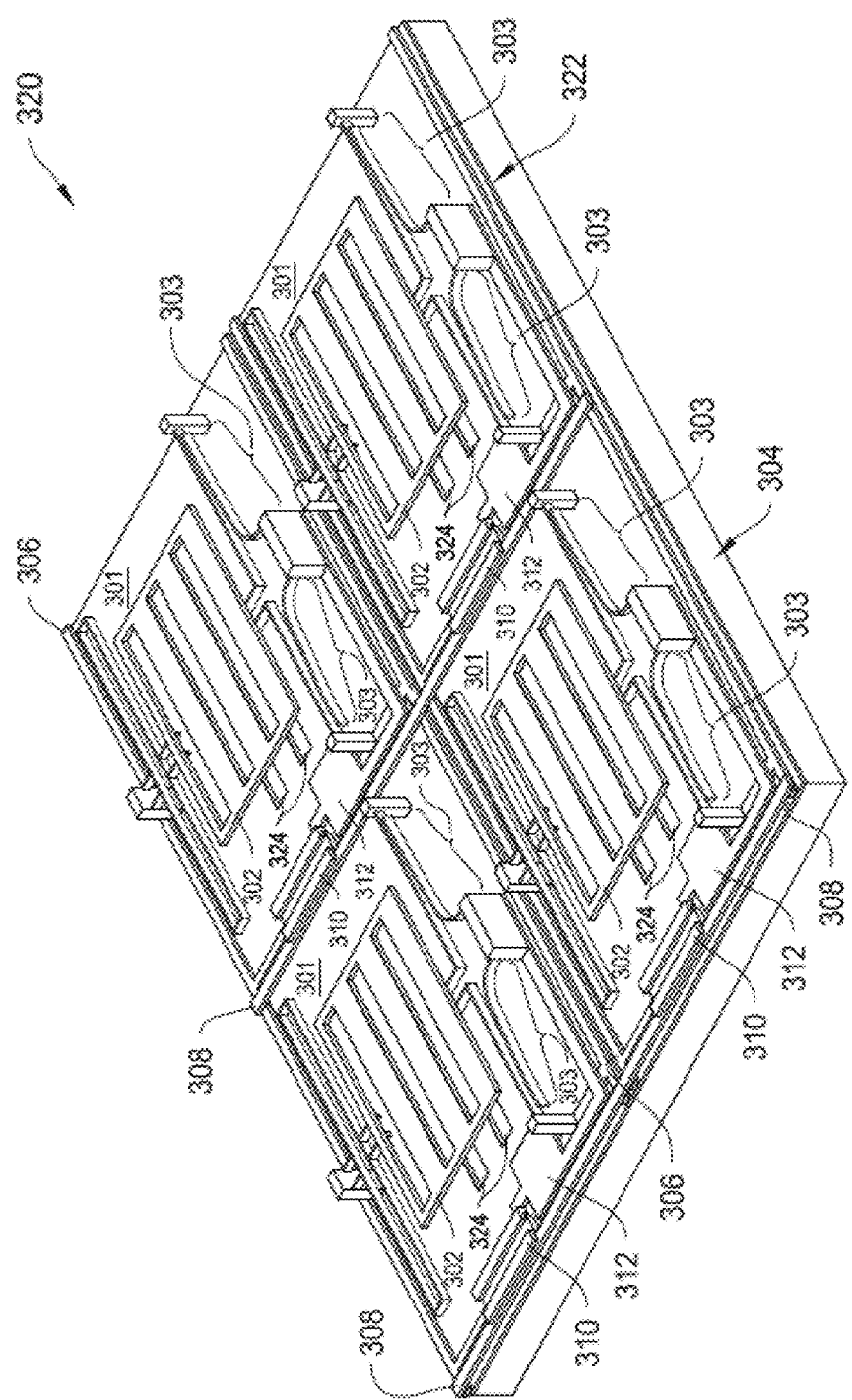
FIG. 3B shows a perspective view of an array of shutter-based light modulators connected to the control matrix of FIG. 3A.

FIG. 3A shows an example schematic diagram of a control matrix 300. The control matrix 300 is suitable for controlling the light modulators incorporated into the MEMS-based display apparatus 100 of FIG. 1A. FIG. 3B shows a perspective view of an array 320 of shutter-based light modulators connected to the control matrix 300 of FIG. 3A. The control matrix 300 may address an array of pixels 320 (the "array 320"). Each pixel 301 can include an elastic shutter assembly 302, such as the shutter assembly 200 of FIG. 2, controlled by an actuator 303. Each pixel also can include an aperture layer 322 that includes apertures 324.

The control matrix 300 is fabricated as a diffused or thin-film-deposited electrical circuit on the surface of a substrate 304 on which the shutter assemblies 302 are formed. The control matrix 300 includes a scan-line interconnect 306 for each row of pixels 301 in the control matrix 300 and a data-interconnect 308 for each column of pixels 301 in the control matrix 300. Each scan-line interconnect 306 electrically connects a write-enabling voltage source 307 to the pixels 301 in a corresponding row of pixels 301. Each data interconnect 308 electrically connects a data voltage source 309 ("Vd source") to the pixels 301 in a corresponding column of pixels. In the control matrix 300, the Vd source 309 provides the majority of the energy to be used for actuation of the shutter assemblies 302. Thus, the data voltage source, Vd source 309, also serves as an actuation voltage source.

Referring to FIGS. 3A and 3B, for each pixel 301 or for each shutter assembly 302 in the array of pixels 320, the control matrix 300 includes a transistor 310 and a capacitor 312. The gate of each transistor 310 is electrically connected to the scan-line interconnect 306 of the row in the array 320 in which the pixel 301 is located. The source of each transistor 310 is electrically connected to its corresponding data interconnect 308. The actuators 303 of each shutter assembly 302 include two electrodes. The drain of each transistor 310 is electrically connected in parallel to one electrode of the corresponding capacitor 312 and to one of the electrodes of the corresponding actuator 303. The other electrode of the capacitor 312 and the other electrode of the actuator 303 in shutter assembly 302 are connected to a common or ground potential. In alternate implementations, the transistors 310 can be replaced with semiconductor diodes and or metal-insulator-metal sandwich type switching elements.

In operation, to form an image, the control matrix 300 write-enables each row in the array 320 in a sequence by applying Vwe to each scan-line interconnect 306 in turn. For a write-enabled row, the application of Vwe to the gates of the transistors 310 of the pixels 301 in the row allows the flow of current through the data interconnects 308 through the transistors 310 to apply a potential to the actuator 303 of the shutter assembly 302. While the row is write-enabled, data voltages Vd are selectively applied to the data interconnects 308. In implementations providing analog gray scale, the data voltage applied to each data interconnect 308 is varied in relation to the desired brightness of the pixel 301 located at the intersection of the write-enabled scan-line interconnect 306 and the data interconnect 308. In implementations providing digital control schemes, the data voltage is selected to be either a relatively low magnitude voltage (i.e., a voltage near ground) or to meet or exceed Vat (the actuation threshold voltage). In response to the application of Vat to a data interconnect 308, the actuator 303 in the corresponding shutter assembly actuates, opening the shutter in that shutter assembly 302. The voltage applied to the data interconnect 308 remains stored in the capacitor 312 of the pixel 301 even after the control matrix 300 ceases to apply Vwe to a row. Therefore, the voltage Vwe does not have to wait and hold on a row for times long enough for the shutter assembly 302 to actuate; such actuation can proceed after the write-enabling voltage has been removed from the row. The capacitors 312 also function as memory elements within the array 320, storing actuation instructions for the illumination of an image frame.

The pixels 301 as well as the control matrix 300 of the array 320 are formed on a substrate 304. The array 320 includes an aperture layer 322, disposed on the substrate 304, which includes a set of apertures 324 for respective pixels 301 in the array 320. The apertures 324 are aligned with the shutter assemblies 302 in each pixel. In some implementations, the substrate 304 is made of a transparent material, such as glass or plastic. In some other implementations, the substrate 304 is made of an opaque material, but in which holes are etched to form the apertures 324.

The shutter assembly 302 together with the actuator 303 can be made bi-stable. That is, the shutters can exist in at least two equilibrium positions (e.g., open or closed) with little or no power required to hold them in either position. More particularly, the shutter assembly 302 can be mechanically bi-stable. Once the shutter of the shutter assembly 302 is set in position, no electrical energy or holding voltage is required to maintain that position. The mechanical stresses on the physical elements of the shutter assembly 302 can hold the shutter in place.

The shutter assembly 302 together with the actuator 303 also can be made electrically bi-stable. In an electrically bi-stable shutter assembly, there exists a range of voltages below the actuation voltage of the shutter assembly, which if applied to a closed actuator (with the shutter being either open or closed), holds the actuator closed and the shutter in position, even if an opposing force is exerted on the shutter. The opposing force may be exerted by a spring such as the spring 207 in the shutter-based light modulator 200 depicted in FIG. 2A, or the opposing force may be exerted by an opposing actuator, such as an "open" or "closed" actuator.

The light modulator array 320 is depicted as having a single MEMS light modulator per pixel. Other implementations are possible in which multiple MEMS light modulators are provided in each pixel, thereby providing the possibility of more than just binary "on' or "off" optical states in each pixel. Certain forms of coded area division gray scale are possible where multiple MEMS light modulators in the pixel are provided, and where apertures 324, which are associated with each of the light modulators, have unequal areas.

Figure 4A:
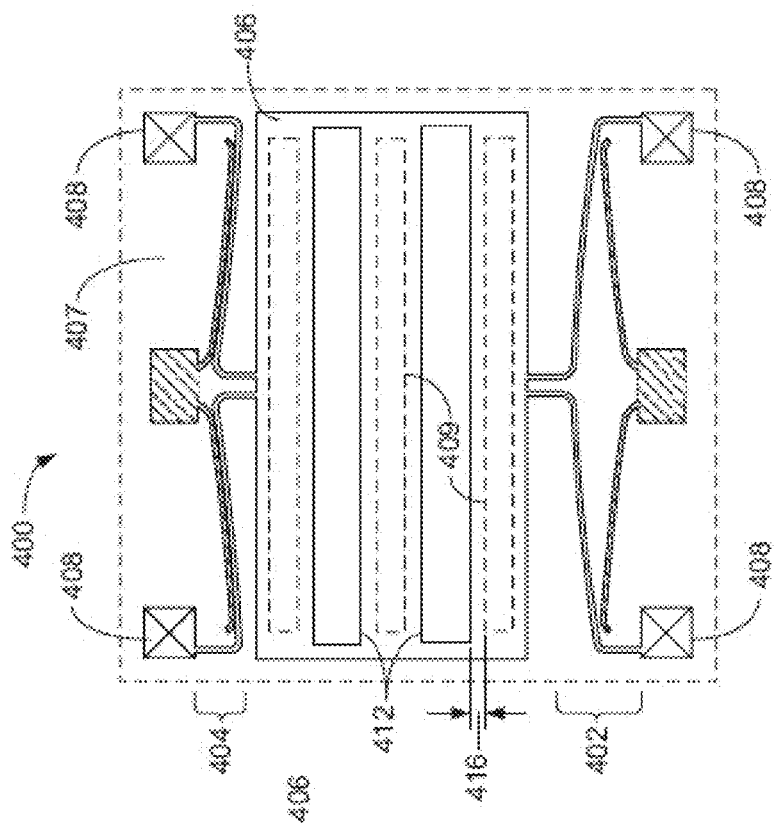
FIG. 4A and FIG. 4B show example view of a dual actuator shutter assembly.
Figure 4B:
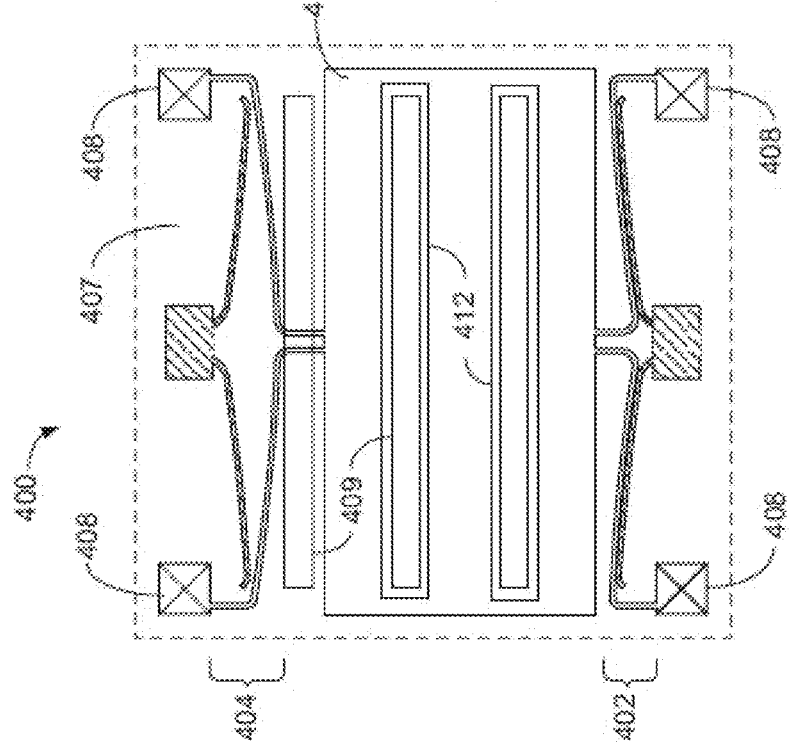

FIGS. 4A and 4B show example views of a dual actuator shutter assembly 400. The dual actuator shutter assembly 400, as depicted in FIG. 4A, is in an open state. FIG. 4B shows the dual actuator shutter assembly 400 in a closed state. In contrast to the shutter assembly 200, the shutter assembly 400 includes actuators 402 and 404 on either side of a shutter 406. Each actuator 402 and 404 is independently controlled. A first actuator, a shutter-open actuator 402, serves to open the shutter 406. A second opposing actuator, the shutter-close actuator 404, serves to close the shutter 406. Both of the actuators 402 and 404 are compliant beam electrode actuators. The actuators 402 and 404 open and close the shutter 406 by driving the shutter 406 substantially in a plane parallel to an aperture layer 407 over which the shutter is suspended. The shutter 406 is suspended a short distance over the aperture layer 407 by anchors 408 attached to the actuators 402 and 404. The inclusion of supports attached to both ends of the shutter 406 along its axis of movement reduces out of plane motion of the shutter 406 and confines the motion substantially to a plane parallel to the substrate. By analogy to the control matrix 300 of FIG. 3A, a control matrix suitable for use with the shutter assembly 400 might include one transistor and one capacitor for each of the opposing shutter-open and shutter-close actuators 402 and 404.

The shutter 406 includes two shutter apertures 412 through which light can pass. The aperture layer 407 includes a set of three apertures 409. In FIG. 4A, the shutter assembly 400 is in the open state and, as such, the shutter-open actuator 402 has been actuated, the shutter-close actuator 404 is in its relaxed position, and the centerlines of the shutter apertures 412 coincide with the centerlines of two of the aperture layer apertures 409. In FIG. 4B, the shutter assembly 400 has been moved to the closed state and, as such, the shutter-open actuator 402 is in its relaxed position, the shutter-close actuator 404 has been actuated, and the light blocking portions of the shutter 406 are now in position to block transmission of light through the apertures 409 (depicted as dotted lines).

Each aperture has at least one edge around its periphery. For example, the rectangular apertures 409 have four edges. In alternative implementations in which circular, elliptical, oval, or other curved apertures are formed in the aperture layer 407, each aperture may have only a single edge. In some other implementations, the apertures need not be separated or disjoint in the mathematical sense, but instead can be connected. That is to say, while portions or shaped sections of the aperture may maintain a correspondence to each shutter, several of these sections may be connected such that a single continuous perimeter of the aperture is shared by multiple shutters.

In order to allow light with a variety of exit angles to pass through apertures 412 and 409 in the open state, it is advantageous to provide a width or size for shutter apertures 412 which is larger than a corresponding width or size of apertures 409 in the aperture layer 407. In order to effectively block light from escaping in the closed state, it is preferable that the light blocking portions of the shutter 406 overlap the apertures 409. FIG. 4B shows a predefined overlap 416 between the edge of light blocking portions in the shutter 406 and one edge of the aperture 409 formed in the aperture layer 407.

The electrostatic actuators 402 and 404 are designed so that their voltage-displacement behavior provides a bi-stable characteristic to the shutter assembly 400. For each of the shutter-open and shutter-close actuators there exists a range of voltages below the actuation voltage, which if applied while that actuator is in the closed state (with the shutter being either open or closed), will hold the actuator closed and the shutter in position, even after an actuation voltage is applied to the opposing actuator. The minimum voltage needed to maintain a shutter's position against such an opposing force is referred to as a maintenance voltage Vm.

Figure 5:
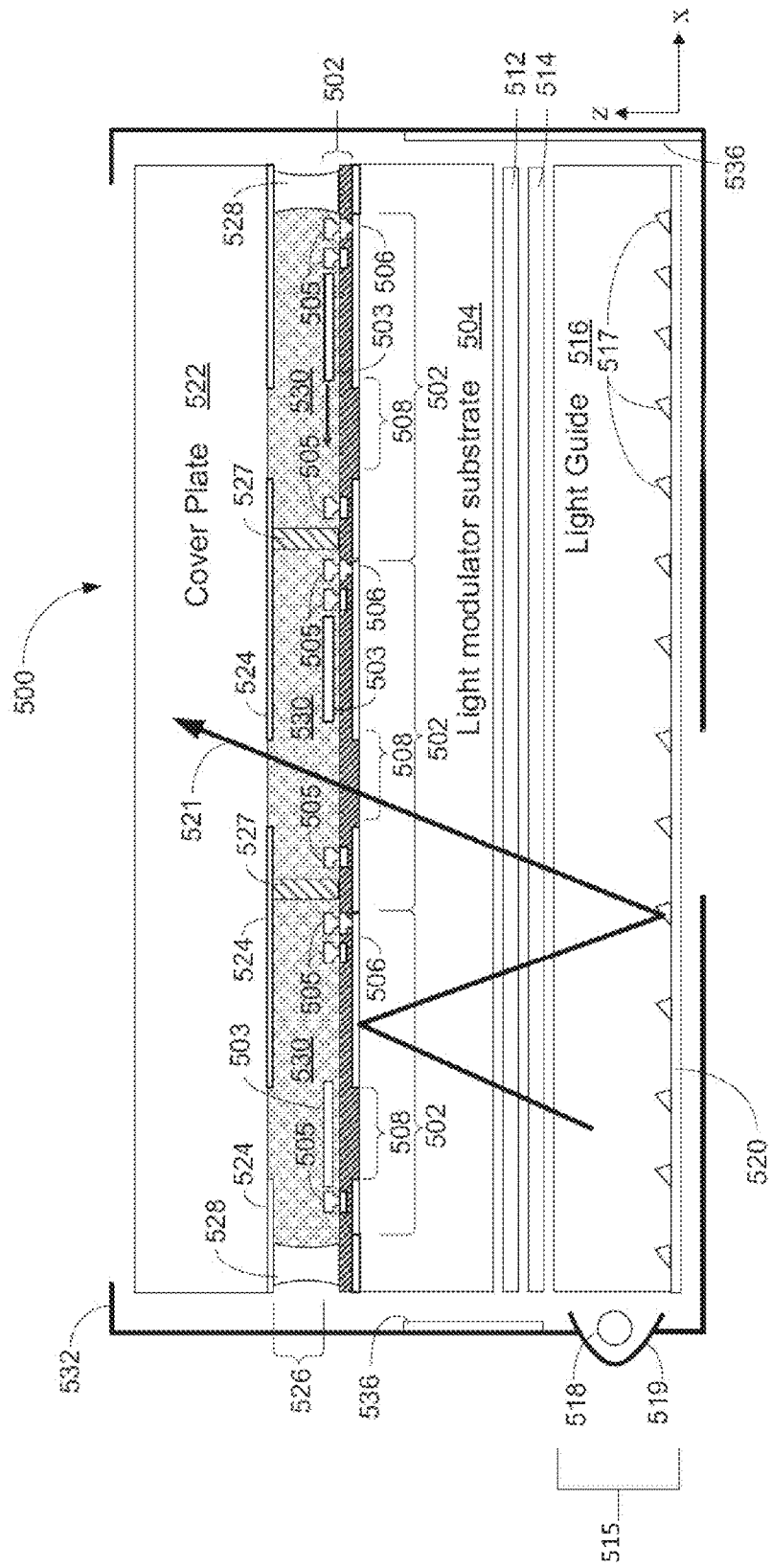
FIG. 5 shows an example cross sectional view of a display apparatus incorporating shutter-based light modulators.

FIG. 5 shows an example cross sectional view of a display apparatus 500 incorporating shutter-based light modulators (shutter assemblies) 502. Each shutter assembly 502 incorporates a shutter 503 and an anchor 505. Not shown are the compliant beam actuators which, when connected between the anchors 505 and the shutters 503, help to suspend the shutters 503 a short distance above the surface. The shutter assemblies 502 are disposed on a transparent substrate 504, such a substrate made of plastic or glass. A rear-facing reflective layer, reflective film 506, disposed on the substrate 504 defines a plurality of surface apertures 508 located beneath the closed positions of the shutters 503 of the shutter assemblies 502. The reflective film 506 reflects light not passing through the surface apertures 508 back towards the rear of the display apparatus 500. The reflective aperture layer 506 can be a fine-grained metal film without inclusions formed in thin film fashion by a number of vapor deposition techniques including sputtering, evaporation, ion plating, laser ablation, or chemical vapor deposition (CVD). In some other implementations, the rear-facing reflective layer 506 can be formed from a mirror, such as a dielectric mirror. A dielectric mirror can be fabricated as a stack of dielectric thin films which alternate between materials of high and low refractive index. The vertical gap which separates the shutters 503 from the reflective film 506, within which the shutter is free to move, is in the range of 0.5 to 10 microns. The magnitude of the vertical gap is preferably less than the lateral overlap between the edge of shutters 503 and the edge of apertures 508 in the closed state, such as the overlap 416 depicted in FIG. 4B.

The display apparatus 500 includes an optional diffuser 512 and/or an optional brightness enhancing film 514 which separate the substrate 504 from a planar light guide 516. The light guide 516 includes a transparent, i.e., glass or plastic material. The light guide 516 is illuminated by one or more light sources 518, forming a backlight. The light sources 518 can be, for example, and without limitation, incandescent lamps, fluorescent lamps, lasers or light emitting diodes (LEDs). A reflector 519 helps direct light from lamp 518 towards the light guide 516. A front-facing reflective film 520 is disposed behind the backlight 516, reflecting light towards the shutter assemblies 502. Light rays such as ray 521 from the backlight that do not pass through one of the shutter assemblies 502 will be returned to the backlight and reflected again from the film 520. In this fashion light that fails to leave the display apparatus 500 to form an image on the first pass can be recycled and made available for transmission through other open apertures in the array of shutter assemblies 502. Such light recycling has been shown to increase the illumination efficiency of the display.

The light guide 516 includes a set of geometric light redirectors or prisms 517 which re-direct light from the lamps 518 towards the apertures 508 and hence toward the front of the display. The light redirectors 517 can be molded into the plastic body of light guide 516 with shapes that can be alternately triangular, trapezoidal, or curved in cross section. The density of the prisms 517 generally increases with distance from the lamp 518.

In some implementations, the aperture layer 506 can be made of a light absorbing material, and in alternate implementations the surfaces of shutter 503 can be coated with either a light absorbing or a light reflecting material. In some other implementations, the aperture layer 506 can be deposited directly on the surface of the light guide 516. In some implementations, the aperture layer 506 need not be disposed on the same substrate as the shutters 503 and anchors 505 (such as in the MEMS-down configuration described below).

In some implementations, the light sources 518 can include lamps of different colors, for instance, the colors red, green and blue. A color image can be formed by sequentially illuminating images with lamps of different colors at a rate sufficient for the human brain to average the different colored images into a single multi-color image. The various color-specific images are formed using the array of shutter assemblies 502. In another implementation, the light source 518 includes lamps having more than three different colors. For example, the light source 518 may have red, green, blue and white lamps, or red, green, blue and yellow lamps. In some other implementations, the light source 518 may include cyan, magenta, yellow and white lamps, red, green, blue and white lamps. In some other implementations, additional lamps may be included in the light source 518. For example, if using five colors, the light source 518 may include red, green, blue, cyan and yellow lamps. In some other implementations, the light source 518 may include white, orange, blue, purple and green lamps or white, blue, yellow, red and cyan lamps. If using six colors, the light source 518 may include red, green, blue, cyan, magenta and yellow lamps or white, cyan, magenta, yellow, orange and green lamps.

A cover plate 522 forms the front of the display apparatus 500. The rear side of the cover plate 522 can be covered with a black matrix 524 to increase contrast. In alternate implementations the cover plate includes color filters, for instance distinct red, green, and blue filters corresponding to different ones of the shutter assemblies 502. The cover plate 522 is supported a predetermined distance away from the shutter assemblies 502 forming a gap 526. The gap 526 is maintained by mechanical supports or spacers 527 and/or by an adhesive seal 528 attaching the cover plate 522 to the substrate 504.

The adhesive seal 528 seals in a fluid 530. The fluid 530 is engineered with viscosities preferably below about 10 centipoise and with relative dielectric constant preferably above about 2.0, and dielectric breakdown strengths above about 104 V/cm. The fluid 530 also can serve as a lubricant. In some implementations, the fluid 530 is a hydrophobic liquid with a high surface wetting capability. In alternate implementations, the fluid 530 has a refractive index that is either greater than or less than that of the substrate 504.

Displays that incorporate mechanical light modulators can include hundreds, thousands, or in some cases, millions of moving elements. In some devices, every movement of an element provides an opportunity for static friction to disable one or more of the elements. This movement is facilitated by immersing all the parts in a fluid (also referred to as fluid 530) and sealing the fluid (e.g., with an adhesive) within a fluid space or gap in a MEMS display cell. The fluid 530 is usually one with a low coefficient of friction, low viscosity, and minimal degradation effects over the long term. When the MEMS-based display assembly includes a liquid for the fluid 530, the liquid at least partially surrounds some of the moving parts of the MEMS-based light modulator. In some implementations, in order to reduce the actuation voltages, the liquid has a viscosity below 70 centipoise. In some other implementations, the liquid has a viscosity below 10 centipoise. Liquids with viscosities below 70 centipoise can include materials with low molecular weights: below 4000 grams/mole, or in some cases below 400 grams/mole. Fluids 530 that also may be suitable for such implementations include, without limitation, de-ionized water, methanol, ethanol and other alcohols, paraffins, olefins, ethers, silicone oils, fluorinated silicone oils, or other natural or synthetic solvents or lubricants. Useful fluids can be polydimethylsiloxanes (PDMS), such as hexamethyldisiloxane and octamethyltrisiloxane, or alkyl methyl siloxanes such as hexylpentamethyldisiloxane. Useful fluids can be alkanes, such as octane or decane. Useful fluids can be nitroalkanes, such as nitromethane. Useful fluids can be aromatic compounds, such as toluene or diethylbenzene. Useful fluids can be ketones, such as butanone or methyl isobutyl ketone. Useful fluids can be chlorocarbons, such as chlorobenzene. Useful fluids can be chlorofluorocarbons, such as dichlorofluoroethane or chlorotrifluoroethylene. Other fluids considered for these display assemblies include butyl acetate and dimethylformamide. Still other useful fluids for these displays include hydro fluoro ethers, perfluoropolyethers, hydro fluoro poly ethers, pentanol, and butanol. Example suitable hydro fluoro ethers include ethyl nonafluorobutyl ether and 2-trifluoromethyl-3-ethoxydodecafluorohexane.

A sheet metal or molded plastic assembly bracket 532 holds the cover plate 522, the substrate 504, the backlight and the other component parts together around the edges. The assembly bracket 532 is fastened with screws or indent tabs to add rigidity to the combined display apparatus 500. In some implementations, the light source 518 is molded in place by an epoxy potting compound. Reflectors 536 help return light escaping from the edges of the light guide 516 back into the light guide 516. Not depicted in FIG. 5 are electrical interconnects which provide control signals as well as power to the shutter assemblies 502 and the lamps 518.

In some other implementations, the roller-based light modulator 220, the light tap 250, or the electrowetting-based light modulation array 270, as depicted in FIGS. 2A-2D, as well as other MEMS-based light modulators, can be substituted for the shutter assemblies 502 within the display apparatus 500.

The display apparatus 500 is referred to as the MEMS-up configuration, wherein the MEMS based light modulators are formed on a front surface of the substrate 504, i.e., the surface that faces toward the viewer. The shutter assemblies 502 are built directly on top of the reflective aperture layer 506. In an alternate implementation, referred to as the MEMS-down configuration, the shutter assemblies are disposed on a substrate separate from the substrate on which the reflective aperture layer is formed. The substrate on which the reflective aperture layer is formed, defining a plurality of apertures, is referred to herein as the aperture plate. In the MEMS-down configuration, the substrate that carries the MEMS-based light modulators takes the place of the cover plate 522 in the display apparatus 500 and is oriented such that the MEMS-based light modulators are positioned on the rear surface of the top substrate, i.e., the surface that faces away from the viewer and toward the light guide 516. The MEMS-based light modulators are thereby positioned directly opposite to and across a gap from the reflective aperture layer 506. The gap can be maintained by a series of spacer posts connecting the aperture plate and the substrate on which the MEMS modulators are formed. In some implementations, the spacers are disposed within or between each pixel in the array. The gap or distance that separates the MEMS light modulators from their corresponding apertures is preferably less than 10 microns, or a distance that is less than the overlap between shutters and apertures, such as overlap 416.

Figure 6A:
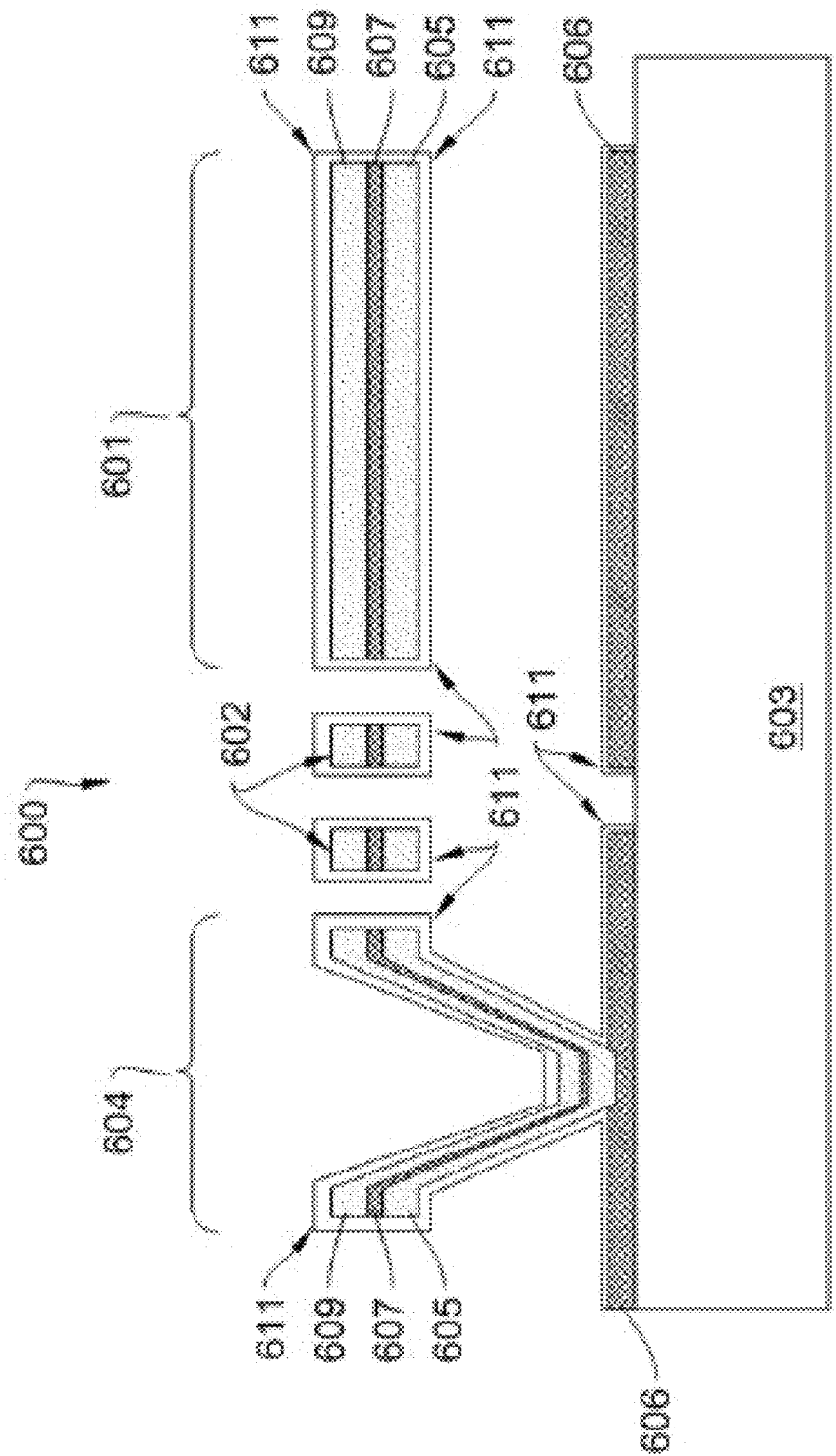

FIGS. 6A-6E show cross sectional views of stages of construction of an example composite shutter assembly. FIG. 6A shows an example cross sectional diagram of a completed composite shutter assembly 600. The shutter assembly 600 includes a shutter 601, two compliant beams 602, and an anchor structure 604 built-up on a substrate 603 and an aperture layer 606. The elements of the composite shutter assembly 600 include a first mechanical layer 605, a conductor layer 607, a second mechanical layer 609, and an encapsulating dielectric 611. At least one of the mechanical layers 605 or 609 can be deposited to thicknesses in excess of 0.15 microns, as one or both of the mechanical layers 605 or 609 serves as the principal load bearing and mechanical actuation member for the shutter assembly 600, though in some implementations, the mechanical layers 605 and 609 may be thinner. Candidate materials for the mechanical layers 605 and 609 include, without limitation, metals such as aluminum (Al), copper (Cu), nickel (Ni), chromium (Cr), molybdenum (Mo), titanium (Ti), tantalum (Ta), niobium (Nb), neodymium (Nd), or alloys thereof; dielectric materials such as aluminum oxide ($Al_2O_3$), silicon oxide ($SiO_2$), tantalum pentoxide ($Ta_2O_5$), or silicon nitride ($Si_3N_4$); or semiconducting materials such as diamond-like carbon, silicon (Si), germanium (Ge), gallium arsenide (GaAs), cadmium telluride (CdTe) or alloys thereof. At least one of the layers, such as the conductor layer 607, should be electrically conducting so as to carry charge on to and off of the actuation elements. Candidate materials include, without limitation, Al, Cu, Ni, Cr, Mo, Ti, Ta, Nb, Nd, or alloys thereof or semiconducting materials such as diamond-like carbon, Si, Ge, GaAs, CdTe or alloys thereof. In some implementations employing semiconductor layers, the semiconductors are doped with impurities such as phosphorus (P), arsenic (As), boron (B), or Al. FIG. 6A depicts a sandwich configuration for the composite in which the mechanical layers 605 and 609, having similar thicknesses and mechanical properties, are deposited on either side of the conductor layer 607. In some implementations, the sandwich structure helps to ensure that stresses remaining after deposition and/or stresses that are imposed by temperature variations will not act to cause bending, warping or other deformation of the shutter assembly 600.

In some implementations, the order of the layers in the composite shutter assembly 600 can be inverted, such that the outside of the shutter assembly 600 is formed from a conductor layer while the inside of the shutter assembly 600 is formed from a mechanical layer.

The shutter assembly 600 can include an encapsulating dielectric 611. In some implementations, dielectric coatings can be applied in conformal fashion, such that all exposed bottom, top, and side surfaces of the shutter 601, the anchor 604, and the beams 602 are uniformly coated. Such thin films can be grown by thermal oxidation and/or by conformal CVD of an insulator such as $Al_2O_3$, chromium (III) oxide ($Cr_2O_3$), titanium oxide ($TiO_2$), hafnium oxide ($HfO_2$), vanadium oxide ($V_2O_5$), niobium oxide ($Nb_2O_5$), $Ta_2O_5$, $SiO_2$, or $Si_3N_4$, or by depositing similar materials via atomic layer deposition. The dielectric coating layer can be applied with thicknesses in the range of 10 nm to 1 micron. In some implementations, sputtering and evaporation can be used to deposit the dielectric coating onto sidewalls.

FIGS. 6B-6E show example cross sectional views of the results of certain intermediate manufacturing stages of an example process used to form the shutter assembly 600 depicted in FIG. 6A. In some implementations, the shutter assembly 600 is built on top of a pre-existing control matrix, such as an active matrix array of thin film transistors, such as the control matrices depicted in FIGS. 3A and 3B.

Figure 6B:
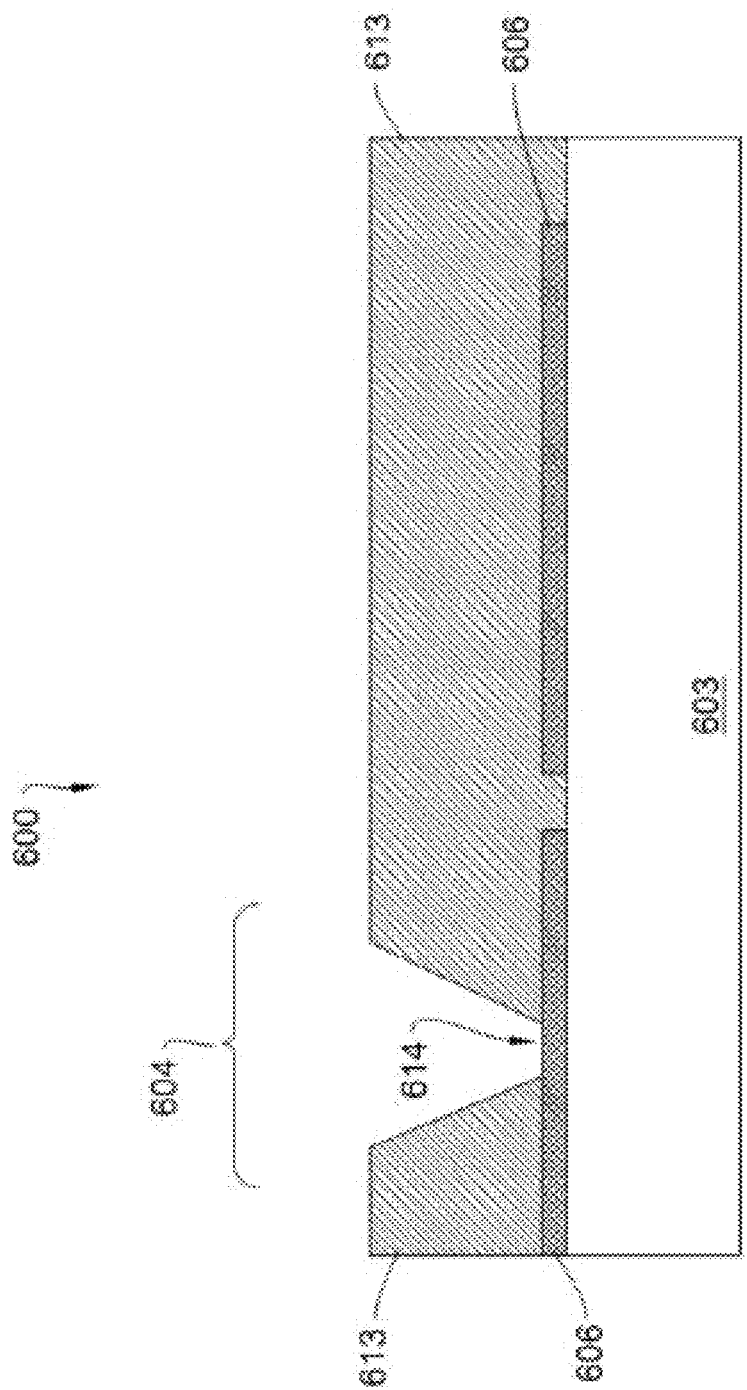

FIG. 6B shows a cross sectional view of the results of a first stage in an example process of forming the shutter assembly 600. As depicted in FIG. 6B, a sacrificial layer 613 is deposited and patterned. In some implementations, polyimide is used as a sacrificial layer material. Other candidate sacrificial layer materials include, without limitation, polymer materials such as polyamide, fluoropolymer, benzocyclobutene, polyphenylquinoxylene, parylene, or polynorbornene. These materials are chosen for their ability to planarize rough surfaces, maintain mechanical integrity at processing temperatures in excess of 250° C., and their ease of etch and/or thermal decomposition during removal. In other implementations, the sacrificial layer 613 is formed from a photoresist, such as polyvinyl acetate, polyvinyl ethylene, and phenolic or novolac resins. An alternate sacrificial layer material used in some implementations is $SiO_2$, which can be removed preferentially as long as other electronic or structural layers are resistant to the hydrofluoric acid solutions used for its removal. One such suitable resistant material is $Si_3N_4$. Another alternate sacrificial layer material is Si, which can be removed preferentially as long as electronic or structural layers are resistant to the fluorine plasmas or xenon difluoride ($XeF_2$) used for its removal, such as most metals and $Si_3N_4$. Yet another alternate sacrificial layer material is Al, which can be removed preferentially as long as other electronic or structural layers are resistant to strong base solutions, such as concentrated sodium hydroxide (NaOH) solutions. Suitable materials include, for example, Cr, Ni, Mo, Ta and Si. Still another alternate sacrificial layer material is Cu, which can be removed preferentially as long as other electronic or structural layers are resistant to nitric or sulfuric acid solutions. Such materials include, for example, Cr, Ni, and Si.

Next the sacrificial layer 613 is patterned to expose holes or vias at the anchor regions 604. In implementations employing polyimide or other non-photoactive materials as the sacrificial layer material, the sacrificial layer material can be formulated to include photoactive agents, allowing regions exposed through a UV photomask to be preferentially removed in a developer solution. Sacrificial layers formed from other materials can be patterned by coating the sacrificial layer 613 in an additional layer of photoresist, photopatterning the photoresist, and finally using the photoresist as an etching mask. The sacrificial layer 613 alternatively can be patterned by coating the sacrificial layer 613 with a hard mask, which can be a thin layer of $SiO_2$ or a metal such as Cr. A photopattern is then transferred to the hard mask by way of photoresist and wet chemical etching. The pattern developed in the hard mask can be resistant to dry chemical, anisotropic, or plasma etching—techniques which can be used to impart deep and narrow anchor holes into the sacrificial layer 613.

After the anchor regions 604 have been opened in the sacrificial layer 613, the exposed and underlying conducting surface 614 can be etched, either chemically or via the sputtering effects of a plasma, to remove any surface oxide layers. Such a contact etching stage can improve the ohmic contact between the underlying conducting surface 614 and the shutter material. After patterning of the sacrificial layer 613, any photoresist layers or hard masks can be removed through use of either solvent cleaning or acid etching.

Figure 6C:
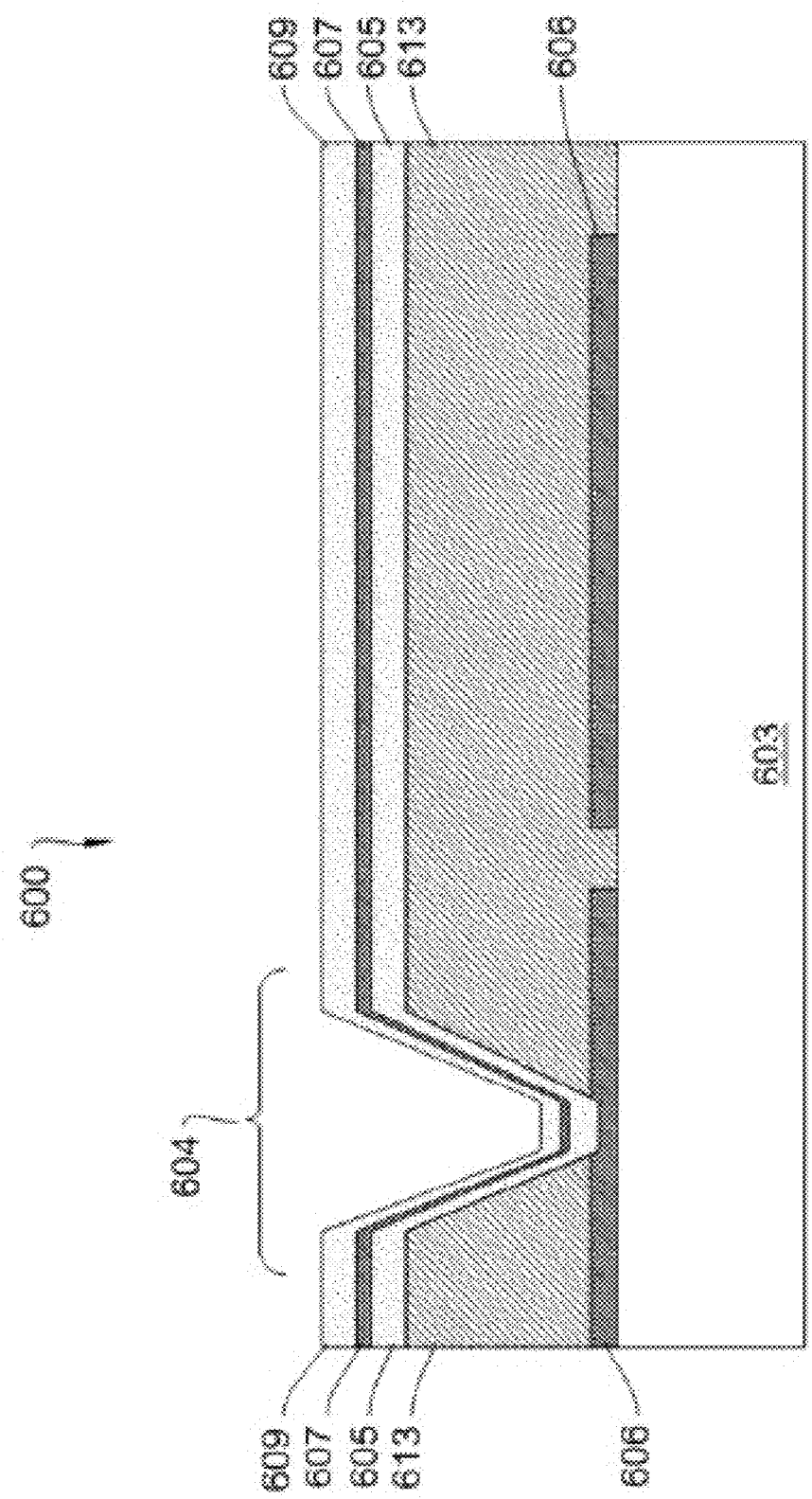

Next, in the process for building the shutter assembly 600, as depicted in FIG. 6C, the shutter materials are deposited. The shutter assembly 600 is composed of multiple thin films: the first mechanical layer 605, the conductor layer 607 and the second mechanical layer 609. In some implementations, the first mechanical layer 605 is an amorphous silicon (a-Si) layer, the conductor layer 607 is Al and the second mechanical layer 609 is a-Si. The first mechanical layer 605, the conductor layer 607, and the second mechanical layer 609 are deposited at a temperature which is below that at which physical degradation occurs for the sacrificial layer 613. For instance, polyimide decomposes at temperatures above about 400° C. Therefore, in some implementations, the first mechanical layer 605, the conductor layer 607 and the second mechanical layer 609 are deposited at temperatures below about 400° C., allowing usage of polyimide as a sacrificial layer material. In some implementations, hydrogenated amorphous silicon (a-Si:H) is a useful mechanical material for the first and second mechanical layers 605 and 609 since it can be grown to thicknesses in the range of about 0.15 to about 3 microns, in a relatively stress-free state, by way of plasma-enhanced chemical vapor deposition (PECVD) from silane gas at temperatures in the range of about 250 to about 350° C. In some of such implementations, phosphine gas ($PH_3$) is used as a dopant so that the a-Si can be grown with resistivities below about 1 ohm-cm. In alternate implementations, a similar PECVD technique can be used for the deposition of $Si_3N_4$, silicon-rich $Si_3N_4$, or $SiO_2$ materials as the first mechanical layer 605 or for the deposition of diamond-like carbon, Ge, SiGe, CdTe, or other semiconducting materials for the first mechanical layer 605. An advantage of the PECVD deposition technique is that the deposition can be quite conformal, that is, it can coat a variety of inclined surfaces or the inside surfaces of narrow via holes. Even if the anchor or via holes which are cut into the sacrificial layer material present nearly vertical sidewalls, the PECVD technique can provide a substantially continuous coating between the bottom and top horizontal surfaces of the anchor.

In addition to the PECVD technique, alternate suitable techniques available for the growth of the first and second mechanical layers 605 and 609 include RF or DC sputtering, metal-organic CVD, evaporation, electroplating or electroless plating.

For the conductor layer 607, in some implementations, a metal thin film, such as Al, is utilized. In some other implementations, alternative metals, such as Cu, Ni, Mo, or Ta can be chosen. The inclusion of such a conducting material serves two purposes. It reduces the overall sheet resistance of the shutter 601, and it helps to block the passage of visible light through the shutter 601, since a-Si, if less than about 2 microns thick, as may be used in some implementations of the shutter 601, can transmit visible light to some degree. The conducting material can be deposited either by sputtering or, in a more conformal fashion, by CVD techniques, electroplating, or electroless plating.

Figure 6D:
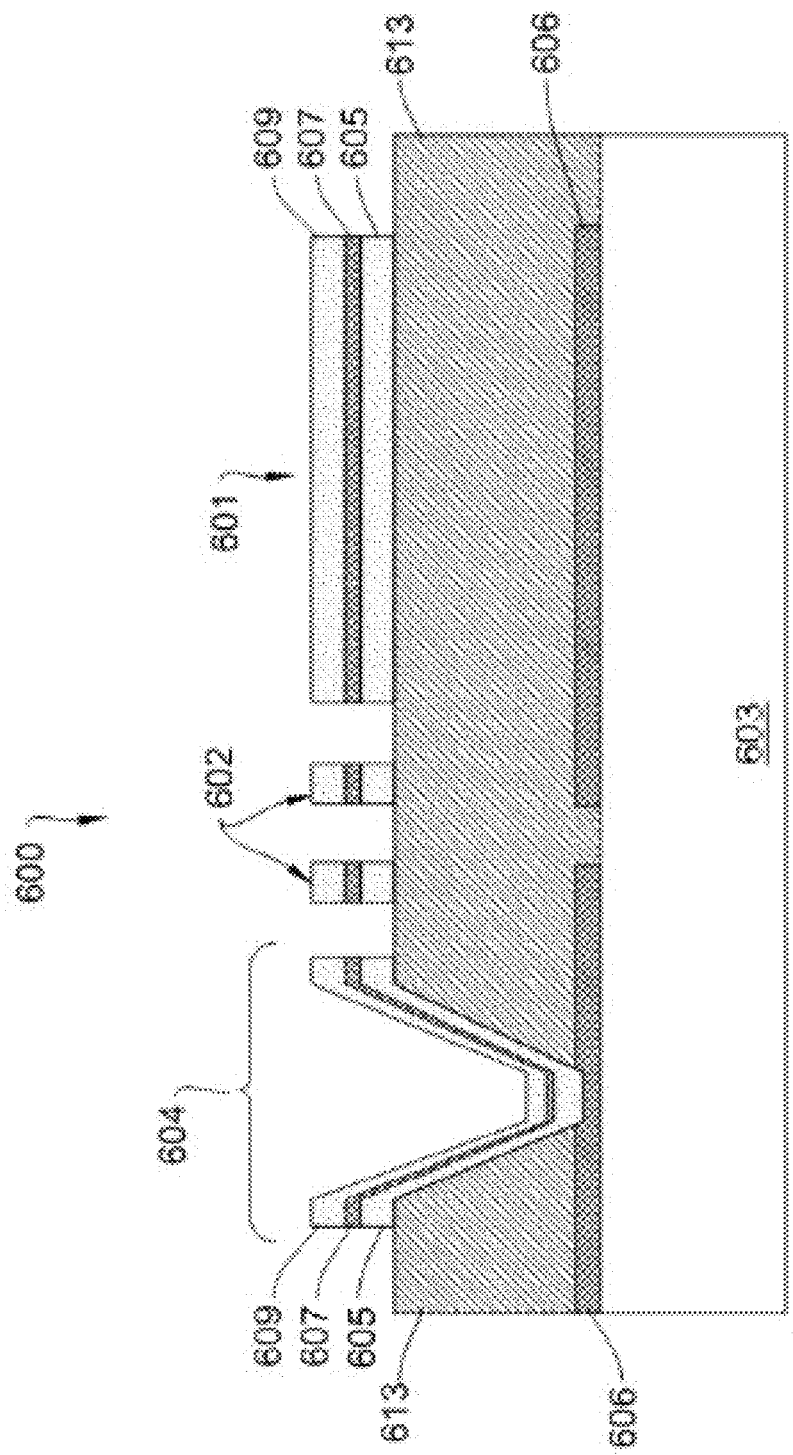

FIG. 6D shows the results of the next set of processing stages used in the formation of the shutter assembly 600. The first mechanical layer 605, the conductor layer 607, and the second mechanical layer 609 are photomasked and etched while the sacrificial layer 613 is still on the substrate 603. First, a photoresist material is applied, then exposed through a photomask, and then developed to form an etch mask. Amorphous silicon, $Si_3N_4$, and $SiO_2$ can then be etched in fluorine-based plasma chemistries. $SiO_2$ mechanical layers also can be etched using HF wet chemicals; and any metals in the conductor layer 607 can be etched with either wet chemicals or chlorine-based plasma chemistries.

The pattern shapes applied through the photomask can influence the mechanical properties, such as stiffness, compliance, and the voltage response in the actuator and shutter 601 of the shutter assembly 600. The shutter assembly 600 includes the compliant beams 602, shown in cross section. Each compliant beam 602 is shaped such that the width is less than the total height or thickness of the shutter material. In some implementations, the beam dimensional ratio is maintained at about 1.4:1 or greater, with the compliant beams 602 being taller or thicker than they are wide.

The results of subsequent stages of the example manufacturing process for building the shutter assembly 600 are depicted in FIG. 6E. The sacrificial layer 613 is removed, which frees-up all moving parts from the substrate 603, except at the anchor points. In some implementations, polyimide sacrificial materials are removed in an oxygen plasma. Other polymer materials used for the sacrificial layer 613 also can be removed in an oxygen plasma, or in some cases by thermal pyrolysis. Some sacrificial layer materials (such as $SiO_2$) can be removed by wet chemical etching or by vapor phase etching.

In a final process, the results of which are depicted in FIG. 6A, the encapsulating dielectric 611 is deposited on all exposed surfaces of the shutter assembly 600. In some implementations, the encapsulating dielectric 611 can be applied in a conformal fashion, such that all bottom, top, and side surfaces of the shutter 601 and the beams 602 are uniformly coated using CVD. In some other implementations, only the top and side surfaces of the shutter 601 are coated. In some implementations, $Al_2O_3$ is used for the encapsulating dielectric 611 and is deposited by atomic layer deposition to thicknesses in the range of about 10 to about 100 nanometers.

Finally, anti-stiction coatings can be applied to the surfaces of the shutter 601 and the beams 602. These coatings prevent the unwanted stickiness or adhesion between two independent beams of an actuator. Suitable coatings include carbon films (both graphite and diamond-like) as well as fluoropolymers, and/or low vapor pressure lubricants, as well as chlorosilanes, hydrocarbon chlorosilanes, fluorocarbon chlorosilanes, such as methoxy-terminated silanes, perfluoronated, amino-silanes, siloxanes and carboxylic acid based monomers and species. These coatings can be applied by either exposure to a molecular vapor or by decomposition of precursor compounds by way of CVD. Anti-stiction coatings also can be created by the chemical alteration of shutter surfaces, such as by fluoridation, silanization, siloxidation, or hydrogenation of insulating surfaces.

One class of suitable actuators for use in MEMS-based shutter displays include compliant actuator beams for controlling shutter motion that is transverse to or in-the-plane of the display substrate. The voltage employed for the actuation of such shutter assemblies decreases as the actuator beams become more compliant. The control of actuated motion also improves if the beams are shaped such that in-plane motion is preferred or promoted with respect to out-of-plane motion. Thus, in some implementations, the compliant actuator beams have a rectangular cross section, such that the beams are taller or thicker than they are wide.

The stiffness of a long rectangular beam with respect to bending within a particular plane scales with the thinnest dimension of that beam in that plane to the third power. It is therefore advantageous to reduce the width of the compliant beams to reduce the actuation voltages for in-plane motion. When using conventional photolithography equipment to define and fabricate the shutter and actuator structures, however, the minimum width of the beams can be limited to the resolution of the optics. And although photolithography equipment has been developed for defining patterns in photoresist with narrow features, such equipment is expensive, and the areas over which patterning can be accomplished in a single exposure are limited. For economical photolithography over large panels of glass or other transparent substrates, the patterning resolution or minimum feature size is typically limited to several microns.

FIGS. 7A-7D show isometric views of stages of construction of an example shutter assembly 700 with narrow sidewall beams. This alternate process yields compliant actuator beams 718 and 720 and a compliant spring beam 716 (collectively referred to as "sidewall beams 716, 718 and 720"), which have a width well below the conventional lithography limits on large glass panels. In the process depicted in FIGS. 7A-7D, the compliant beams of shutter assembly 700 are formed as sidewall features on a mold made from a sacrificial material. The process is referred to as a sidewall beams process.

The process of forming the shutter assembly 700 with the sidewall beams 716, 718 and 720 begins, as depicted in FIG. 7A, with the deposition and patterning of a first sacrificial material 701. The pattern defined in the first sacrificial material 701 creates openings or vias 702 within which anchors for the shutter assembly 700 eventually will be formed. The deposition and patterning of the first sacrificial material 701 is similar in concept, and uses similar materials and techniques, as those described for the deposition and patterning described in relation to FIGS. 6A-6E.

Figure 7B:
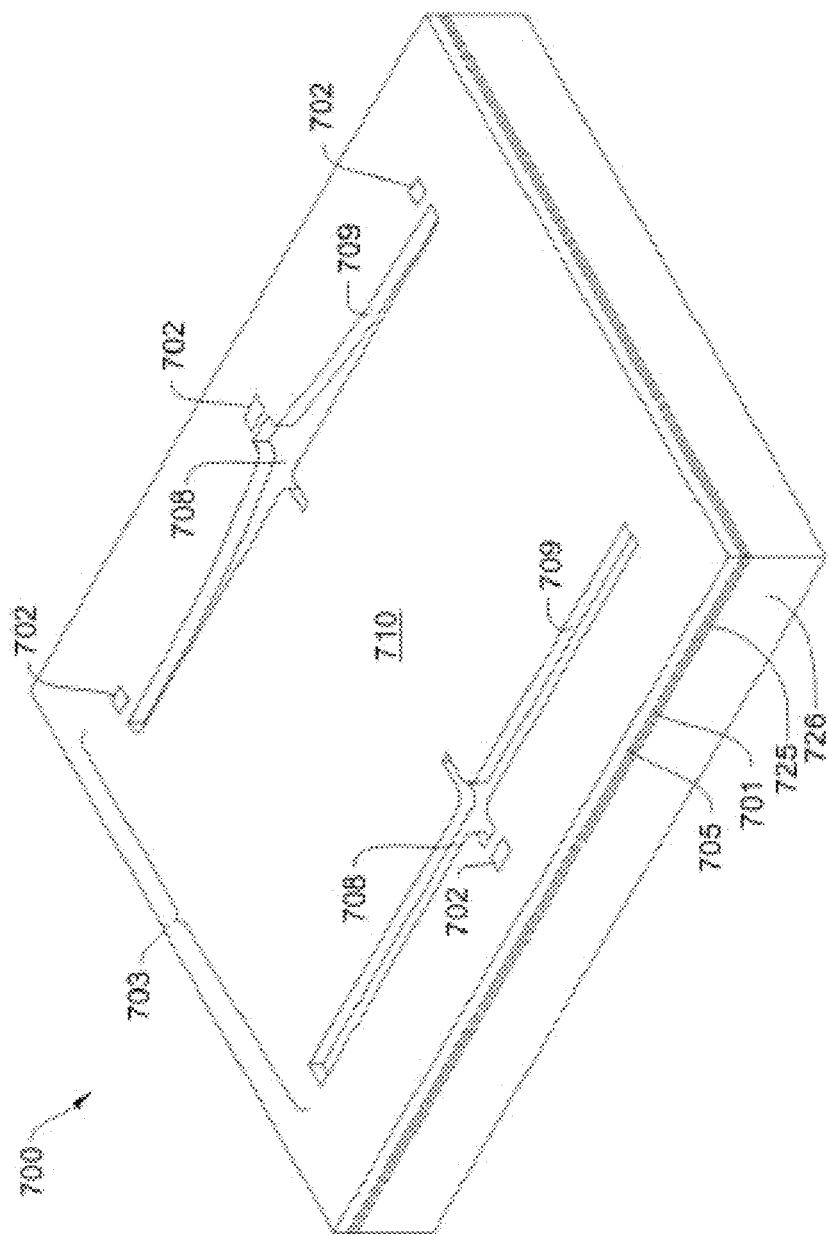

The process of forming the sidewall beams 716, 718 and 720 continues with the deposition and patterning of a second sacrificial material 705. FIG. 7B shows the shape of a mold 703 that is created after patterning of the second sacrificial material 705. The mold 703 also includes the first sacrificial material 701 with its previously defined vias 702. The mold 703 in FIG. 7B includes two distinct horizontal levels. The bottom horizontal level 708 of the mold 703 is established by the top surface of the first sacrificial layer 701 and is accessible in those areas where the second sacrificial material 705 has been etched away. The top horizontal level 710 of the mold 703 is established by the top surface of the second sacrificial material 705. The mold 703 depicted in FIG. 7B also includes substantially vertical sidewalls 709. Materials for use as the first and second sacrificial materials 701 and 705 are described above with respect to the sacrificial layer 613 of FIGS. 6A-6E.

Figure 7C:
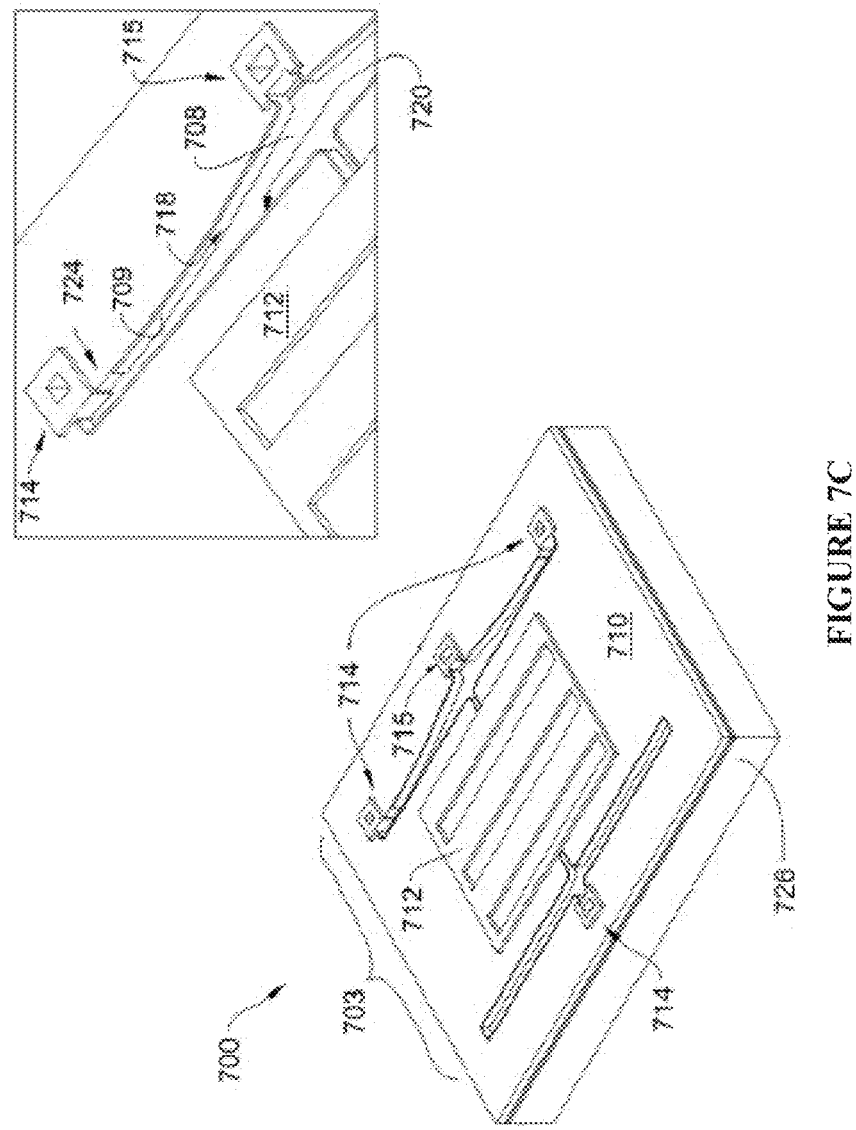

The process of forming the sidewall beams 716, 718 and 720 continues with the deposition and patterning of shutter material onto all of the exposed surfaces of the sacrificial mold 703, as depicted in FIG. 7C. Suitable materials for use in forming the shutter 712 are described above with respect to the first mechanical layer 605, the conductor layer 607, and the second mechanical layer 609 of FIGS. 6A-6E. The shutter material is deposited to a thickness of less than about 2 microns. In some implementations, the shutter material is deposited to have a thickness of less than about 1.5 microns. In some other implementations, the shutter material is deposited to have a thickness of less than about 1.0 microns, and as thin as about 0.10 microns. After deposition, the shutter material (which may be a composite of several materials as described above) is patterned, as depicted in FIG. 7C. First, a photoresist is deposited on the shutter material. The photoresist is then patterned. The pattern developed into the photoresist is designed such that the shutter material, after a subsequent etch stage, remains in the region of the shutter 712 as well as at the anchors 714.

The manufacturing process continues with applying an anisotropic etch, resulting in the structure depicted in FIG. 7C. The anisotropic etch of the shutter material is carried out in a plasma atmosphere with a voltage bias applied to the substrate 726 or to an electrode in proximity to the substrate 726. The biased substrate 726 (with electric field perpendicular to the surface of the substrate 726) leads to acceleration of ions toward the substrate 726 at an angle nearly perpendicular to the substrate 726. Such accelerated ions, coupled with the etching chemicals, lead to etch rates that are much faster in a direction that is normal to the plane of the substrate 726 as compared to directions parallel to the substrate 726. Undercut-etching of shutter material in the regions protected by a photoresist is thereby substantially eliminated. Along the vertical sidewalls 709 of the mold 703, which are substantially parallel to the track of the accelerated ions, the shutter material also is substantially protected from the anisotropic etch. Such protected sidewall shutter material form the sidewall beams 716, 718, and 720 for supporting the shutter 712. Along other (non-photoresist-protected) horizontal surfaces of the mold 703, such as the top horizontal surface 710 or the bottom horizontal surface 708, the shutter material has been substantially completely removed by the etch.

The anisotropic etch used to form the sidewall beams 716, 718 and 720 can be achieved in either an RF or DC plasma etching device as long as provision for electrical bias of the substrate 726 or of an electrode in close proximity of the substrate 726 is supplied. For the case of RF plasma etching, an equivalent self-bias can be obtained by disconnecting the substrate holder from the grounding plates of the excitation circuit, thereby allowing the substrate potential to float in the plasma. In some implementations, it is possible to provide an etching gas such as trifluoromethane ($CHF_3$), perfluorobutene ($C_4F_8$), or chloroform ($CHCl_3$) in which both carbon and hydrogen and/or carbon and fluorine are constituents in the etch gas. When coupled with a directional plasma, achieved again through voltage biasing of the substrate 726, the liberated carbon (C), hydrogen (H), and/or fluorine (F) atoms can migrate to the vertical sidewalls 709 where they build up a passive or protective quasi-polymer coating. This quasi-polymer coating further protects the sidewall beams 716, 718 and 720 from etching or chemical attack.

The process of forming the sidewall beams 716, 718 and 720 is completed with the removal of the remainder of the second sacrificial material 705 and the first sacrificial material 701. The result is shown in FIG. 7D. The process of removing sacrificial material is similar to that described with respect to FIG. 6E. The material deposited on the vertical sidewalls 709 of the mold 703 remain as the sidewall beams 716, 718 and 720. The sidewall beam 716 serves as a spring mechanically connecting the anchors 714 to the shutter 712, and also provides a passive restoring force and to counter the forces applied by the actuator formed from the compliant beams 718 and 720. The anchors 714 connect to an aperture layer 725. The sidewall beams 716, 718 and 720 are tall and narrow. The width of the sidewall beams 716, 718 and 720, as formed from the surface of the mold 703, is similar to the thickness of the shutter material as deposited. In some implementations, the width of sidewall beam 716 will be the same as the thickness of shutter 712. In some other implementations, the beam width will be about ½ the thickness of the shutter 712. The height of the sidewall beams 716, 718 and 720 is determined by the thickness of the second sacrificial material 705, or in other words, by the depth of the mold 703, as created during the patterning operation described in relation to FIG. 7B. As long as the thickness of the deposited shutter material is chosen to be less than about 2 microns, the process depicted in FIGS. 7A-7D is well suited for the production of narrow beams. In fact, for many applications the thickness range of 0.1 to 2.0 micron is quite suitable. Conventional photolithography would limit the patterned features shown in FIGS. 7A, 7B and 7C to much larger dimensions, for instance allowing minimum resolved features no smaller than 2 microns or 5 microns.

FIG. 7D depicts an isomeric view of the shutter assembly 700, formed after the release operation in the above-described process, yielding compliant beams with cross sections of high aspect ratios. As long as the thickness of the second sacrificial material 705 is, for example, greater than about 4 times larger than the thickness of the shutter material, the resulting ratio of beam height to beam width will be produced to a similar ratio, i.e., greater than about 4:1.

An optional stage, not illustrated above but included as part of the process leading to FIG. 7C, involves isotropic etching of the sidewall beam material to separate or decouple the compliant load beams 720 from the compliant drive beams 718. For instance, the shutter material at point 724 has been removed from the sidewall through use of an isotropic etch. An isotropic etch is one whose etch rate is substantially the same in all directions, so that sidewall material in regions such as point 724 is no longer protected. The isotropic etch can be accomplished in the typical plasma etch equipment as long as a bias voltage is not applied to the substrate 726. An isotropic etch also can be achieved using wet chemical or vapor phase etching techniques. Prior to this optional fourth masking and etch stage, the sidewall beam material exists essentially continuously around the perimeter of the recessed features in the mold 703. The fourth mask and etch stage is used to separate and divide the sidewall material, forming the distinct beams 718 and 720. The separation of the beams 718 and 720 at point 724 is achieved through a fourth process of photoresist dispense, and exposure through a mask. The photoresist pattern in this case is designed to protect the sidewall beam material against isotropic etching at all points except at the separation point 724.

As a final stage in the sidewall process, an encapsulating dielectric is deposited around the outside surfaces of the sidewall beams 716, 718 and 720.

In order to protect the shutter material deposited on the vertical sidewalls 709 of the mold 703 and to produce the sidewall beams 716, 718 and 720 of substantially uniform cross section, some particular process guidelines can be followed. For instance, in FIG. 7B, the sidewalls 709 can be made as vertical as possible. Slopes at the vertical sidewalls 709 and/or exposed surfaces become susceptible to the anisotropic etch. In some implementations, the vertical sidewalls 709 can be produced by the patterning operation at FIG. 7B, such as the patterning of the second sacrificial material 705 in an anisotropic fashion. The use of an additional photoresist coating or a hard mask in conjunction with patterning of the second sacrificial layer 705 allows the use of aggressive plasmas and/or high substrate bias in the anisotropic etch of the second sacrificial material 705 while mitigating against excessive wear of the photoresist. The vertical sidewalls 709 also can be produced in photoimageable sacrificial materials as long as care is taken to control the depth of focus during the UV exposure and excessive shrinkage is avoided during final cure of the resist.

Another process guideline that helps during sidewall beam processing relates to the conformality of the shutter material deposition. The surfaces of the mold 703 can be covered with similar thicknesses of the shutter material, regardless of the orientation of those surfaces, either vertical or horizontal. Such conformality can be achieved when depositing with CVD. In particular, the following conformal techniques can be employed: PECVD, low pressure chemical vapor deposition (LPCVD), and atomic or self-limited layer deposition (ALD). In the above CVD techniques the growth rate of the thin film can be limited by reaction rates on a surface as opposed to exposing the surface to a directional flux of source atoms. In some implementations, the thickness of material grown on vertical surfaces is at least 50% of the thickness of material grown on horizontal surfaces. Alternatively, shutter materials can be conformally deposited from solution by electroless plating or electroplating, after a metal seed layer is provided that coats the surfaces before plating.

Figure 8:
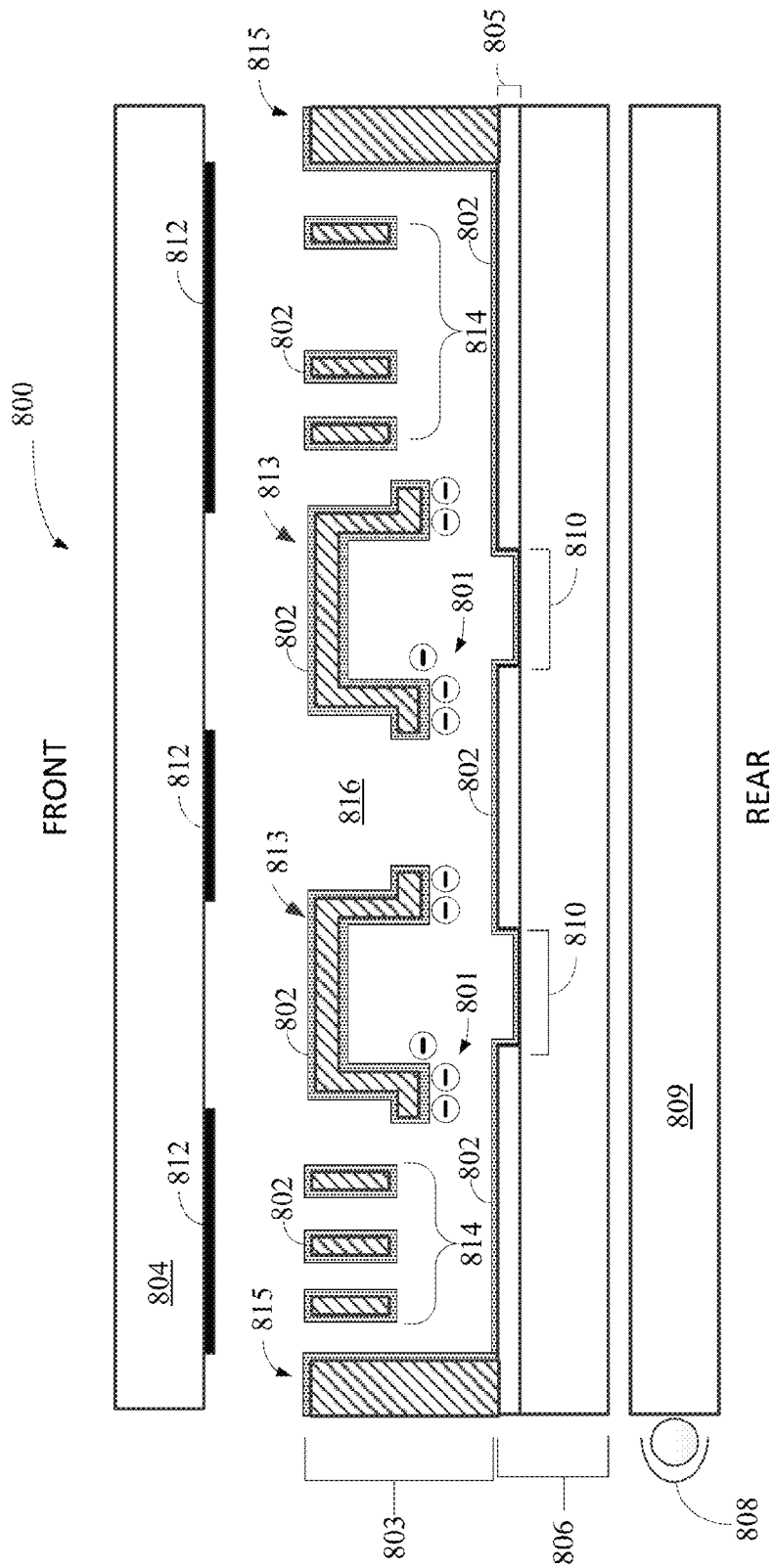
FIG. 8 shows a cross sectional view of an example display apparatus having a single layer passivation layer.

FIG. 8 shows a cross sectional view of an example display apparatus 800 having a single layer passivation layer. In particular, FIG. 8 shows a display apparatus 800 with charge accumulation or charge buildup 801 over dielectric layer 802 of a shutter assembly 803. The display apparatus 800 includes a cover plate 804, the shutter assembly 803, an aperture layer 805, a transparent substrate 806, a backlight 807 and a light source 808. The light source 808 introduces light into the backlight 809. The light from the backlight 809 propagates through one or more apertures 810 formed in the aperture layer 805 towards the cover plate 804 facing the front of the display apparatus 800. The cover plate 804 includes a light absorbing layer 812 for absorbing ambient light from the front of the display device to improve the contrast ratio of the display apparatus 800. The aperture layer 805 and the light absorbing layer 812 can be collectively referred to as light blocking layers.

The shutter assembly 803 includes a shutter 813 suspended over the aperture layer 805 by actuators 814 and anchors 815. The actuators 814 are actuated to move the shutter 813 over the apertures 810 such that the shutter 813 substantially covers the apertures 810 in a closed position and uncovers the apertures 810 in an open position. The shutter assembly 803 is immersed in a fluid 816 for providing lubrication and to reduce the likelihood of stiction.

The shutter assembly 803 and the aperture layer 805 are coated with a dielectric layer 802 for providing passivation. The dielectric layer 802 provides protection and insulation to the shutter assembly 803 and the aperture layer 810. For example, the passivation layer 802 can provide protection from subsequent manufacturing and packaging processes. Also, the dielectric layer 802 can provide insulation to current carrying conductors incorporated into the shutter assembly 803.

The dielectric layer 802, however, may experience an accumulation or buildup of charge over its surface. For example, FIG. 8 shows charge buildup 801 on the surface of dielectric layer 802 coating the shutter 813. This charge buildup 801, in turn, results in electrostatic forces between unequally charged surfaces. For example, electrostatic forces can be generated due to a differential charge buildup between the shutter 813 and the aperture layer 805. These electrostatic forces can introduce defects in the operation of the display device, such as, slowing the speed of actuation of the shutter 813, the shutter 813 being temporarily or permanently stuck in an undesired open or closed or intermediate position, etc. A differential charge buildup also may occur between various components of the actuators 814 (e.g., between a drive beam and a load beam). This differential charge buildup may also generate electrostatic forces that can lead to defects in the operation of the display device.

While FIG. 8 shows charge buildup 801 over only a portion of the shutter 804, it is understood that the charge buildup may occur at any portion of the display device 800 that is coated with the dielectric coating 802. For example, the charge buildup may occur over the dielectric coating 802 deposited on the shutter 813, the actuators 814, the anchors 815, or any other portions of the shutter assembly 803 that are coated with the dielectric material 802. Furthermore, while the charge buildup 801 shown in FIG. 8 includes negative charges, it is also understood that the charge buildup may include positive charges instead.

The charge buildup 801 is typically a result of the presence of electrical traps on the surface of the dielectric layer 802 and the presence of mobile charges in the fluid 816. The higher the density of electrical traps, the greater is the charge buildup 801. The density of the electrical traps formed over the dielectric layer 802 is a function, in part, of the dielectric material used in the dielectric layer 802. Typically, the passivation stage uses dielectric materials having a high density of electrical traps because of the lower material and processing costs, as well as the greater speed with which they can be deposited.

The density of the electrical traps also may be affected by the technique employed in depositing the dielectric layer 802. For example, typical techniques employed in depositing the dielectric layer 802 such as chemical vapor deposition (CVD) or plasma enhanced chemical vapor deposition (PECVD) may result in the dielectric layer 802 having a higher density of electrical traps.

As discussed below with reference to FIGS. 9-12, the density of electrical traps, and in turn the charge buildup 801, can be reduced by employing multiple layers of dielectrics. By reducing the charge buildup 801, risks of undesired operation of the shutter assembly 803 can be reduced.

Figure 9:
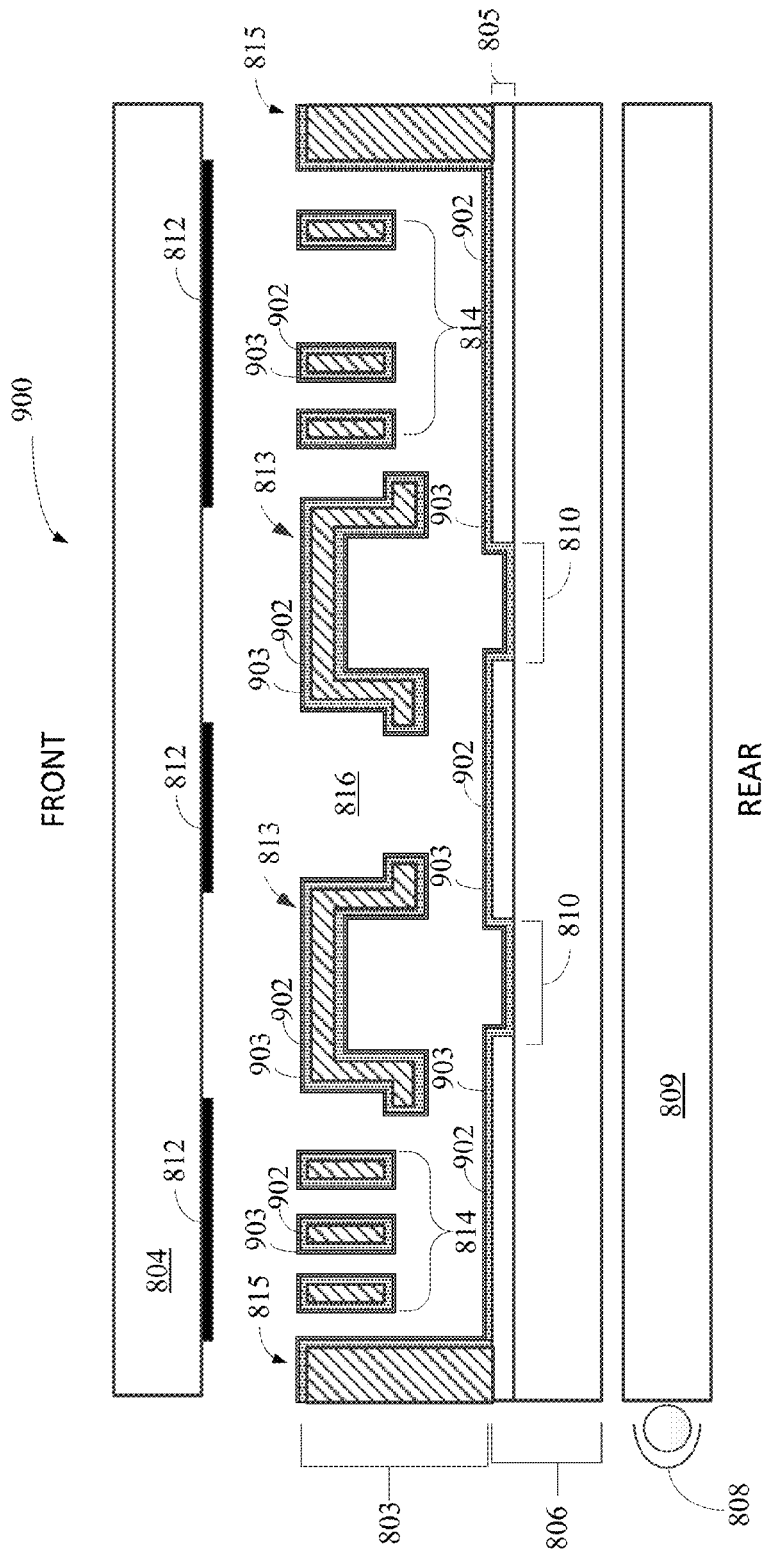
FIG. 9 shows a cross sectional view of an example display apparatus having a multi-layer protective coating.

FIG. 9 shows a cross sectional view of an example display apparatus 900 having a multi-layer protective coating. In particular, the display apparatus 900 shown in FIG. 9 includes all of the components of the display apparatus 800 shown in FIG. 8. In contrast, though, in the display apparatus 900, the shutter assembly 803 and the aperture layer 805 are coated with two dielectric layers: a first inner dielectric layer (IDL) 902 and a first outer dielectric layer (ODL) 903. The deposition of the two dielectric layers is carried out during a passivation stage, such that the first ODL 903 is deposited over the first IDL 902. As such, the first ODL 903 is in contact with the fluid 816. In the implementation shown in FIG. 9, the passivation stage is carried out after the shutter assembly 803 is released from a sacrificial mold over which the shutter assembly 803 is formed. Therefore, the two dielectric layers coat substantially all of the exposed surfaces of the shutter assembly 803. For example, the two dielectric layers cover the surfaces of the shutter 813 that are substantially parallel to the substrate 806 and also surfaces that are substantially normal to the substrate 806. Furthermore, the two dielectric layers coat the actuators 814, the anchors 815, and the aperture layer 805. However, in some other implementations, the passivation stage may be carried out before the release of the shutter assembly 803. In such implementations, only some portions of the shutter assembly 803 will be coated with the two dielectric materials.

The first IDL 902 and the first ODL 903 can employ dielectric materials with different properties. Specifically, the electrical trap density associated with the dielectric material used for the first ODL 903 is considerably less than the electrical trap density associated with the dielectric material used for the first IDL 902. For example, the electrical trap density of the dielectric material used for the first ODL 903 can be as low as about $10^{10}$ cm$^{-2}$ eV$^{-1}$, while the electrical trap density of the dielectric material used for the first IDL 902 can be as high as about $10^{14}$ cm$^{-2}$ eV$^{-1}$. The first ODL 903 can employ dielectric materials such as, without limitation, high quality silicon oxide ($SiO_2$), high quality aluminum oxide ($Al_2O_3$), or high quality $SiN_x$; whereas the first IDL 902 can employ dielectric material such as, without limitation, hydrogenated silicon nitride ($SiN_x$:H), $TiO_2$, $HfO_2$, $V_2O_5$, $Nb_2O_5$, $Ta_2O_5$, silicon oxy nitride (SiON), zirconium dioxide ($ZrO_2$), or lanthanum oxide ($La_2O_2$). In some implementations, similar dielectric materials, such as silicon nitride, can be used for both the first IDL 902 and the first ODL 903. In such implementations, however, the electrical trap density of the dielectric material used for the first ODL 903 is lower than that of the similar dielectric material used for the first IDL 902. Different electrical trap densities for similar dielectric materials used for both the IDL 902 and the ODL 903 can be achieved by manipulating factors such as the deposition technique, the temperature, and the plasma conditions.

As the first ODL 903 has a lower density of electrical traps, the charge buildup over various portions of the shutter assembly 803 is also reduced. For example, charge buildup over the shutter 813 in the display apparatus 900 will be relatively lower as compared to the charge buildup 801 shown on the display apparatus 800 in FIG. 8. Similarly, charge buildup will also be reduced over the actuators 814, the anchors 815 and the substrate 806. This reduction in charge buildup over various portions of the shutter assembly 803 and the substrate 806 reduces voltage differentials between these portions. As a result, electrostatic forces generated due to these voltage differentials are also reduced. With reduced undesired electrostatic forces, the risks of undesired operation of the shutter assembly 803 are also reduced.

In some implementations, the deposition techniques used for depositing the first IDL 902 can be different from the deposition techniques used for depositing the first ODL 903. For example, the first IDL 902 can be deposited using techniques such as CVD or PECVD, while the first ODL 903 can be deposited using deposition techniques such as atomic layer deposition (ALD). In some other implementations, similar deposition techniques can be used to deposit both the first IDL 902 and the first ODL 903.

In some implementations, the thickness of the first IDL 902 is greater than the thickness of the first ODL 903. Typically, a relatively thin first ODL 903 is sufficient in reducing charge buildup. Therefore, in implementations where the first ODL 903 is deposited using more costly and time consuming techniques such as ALD, the thin first ODL 903 can still be deposited without incurring substantial cost or additional processing time. In such implementations, the first IDL 902 can then be deposited using less expensive and faster deposition techniques such as CVD and PECVD to a particular thickness such that the combined thickness of the first IDL 902 and the first ODL 903 meets the dielectric breakdown strength specification of the display apparatus 900. For example, the IDL 902 can be deposited to a thickness of about 10 nm to about 300 nm and the ODL 903 can be deposited to a thickness of about 1 nm to about 100 nm. The first IDL 902 can employ the same materials and deposition techniques that are employed for the dielectric layer 802 of FIG. 8.

In some implementations, one or more dielectric layers in addition to the first IDL 902 and first ODL 903 can be deposited over the shutter assembly 803 and the substrate 806. These additional dielectric layers can be used to provide additional electrical insulation. Typically, the additional dielectric layers are deposited such that the dielectric layer having the least electrical trap density is deposited last so that it can be in contact with the fluid 816.

Mobile charges in the fluid 816 can move within the fluid 816 in the presence of electric fields generated during actuation of the shutters 813. But these charges can accumulate on the surface of the dielectric deposited on the shutter 813 and the actuators 814 (or for that matter, on any component of the display device 800 having a dielectric coating) due to the presence of electrical traps on the surface of the dielectric. As a result, the accumulated charges are no longer able to move within the fluid in response to the electric fields. In some situations, the accumulation of charges can get even worse (i.e., increase) with repeated changing polarities of the electric fields, which occur during repeated actuation and de-actuation of the shutter 813.

But, when dielectrics with low trap densities are used, the accumulation of charges on the surface of the dielectric is considerably reduced. Furthermore, the accumulation of charges over dielectrics with lower trap densities may actually reduce even further due to dissipation of the charges with repeated changing polarities of the electric fields. Therefore, two surfaces having dielectrics with different electrical trap densities can have different magnitudes of accumulated charge over time even when experiencing the same electric fields. The different magnitudes of accumulated charges result in electric fields that can affect the operation of the shutter 813.

Thus, by depositing a dielectric with the least electrical trap density last, the surfaces are coated with the same low electrical trap density dielectric. As a result, not only is the accumulation of charges reduced, but even if some accumulation of charges does occur, the magnitudes of such accumulation over various surfaces will be relatively similar. This results in a reduction in the magnitude of the electric fields acting on the shutter 813, and therefore, a reduction in the risks of undesired operation of the shutter 813.

Typically, materials used for the first IDL 902 and first ODL 903 include a substantially transparent material such as $SiO_2$, $Al_2O_3$, $SiN_x$, $SiN_x$:H, $TiO_2$, $HfO_2$, $V_2O_5$, $Nb_2O_5$, $Ta_2O_5$, SiON, $ZrO_2$, and $La_2O_2$. As a result, the first IDL 902 and/or the first ODL 903 can extend over the apertures 810, as shown in FIG. 9, without substantially blocking light propagating through the apertures 810.

Figure 10:
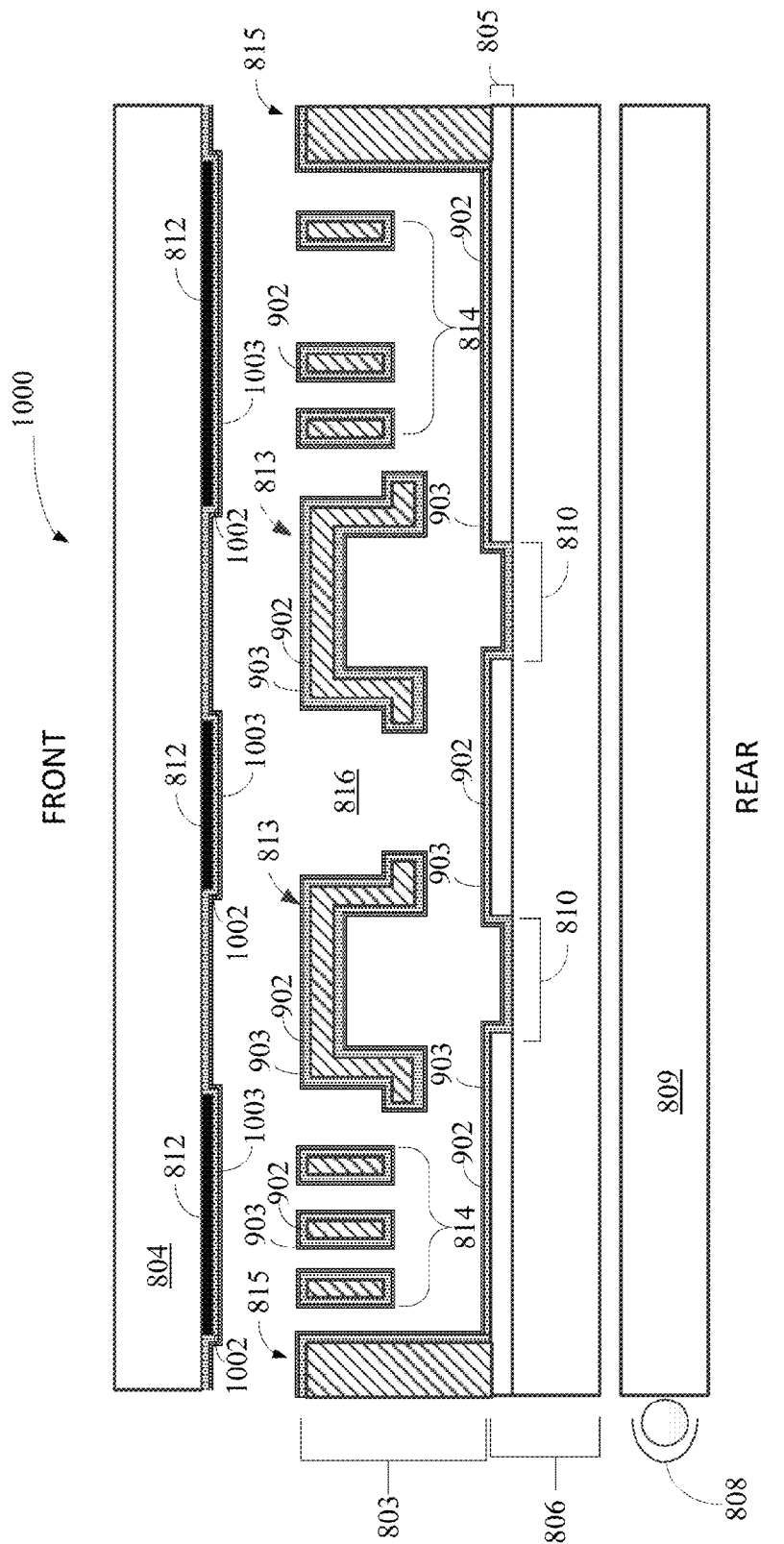
FIG. 10 shows a cross sectional view of another example display apparatus having a multi-layer protective coating.

FIG. 10 shows a cross sectional view of another example display apparatus 1000 having a multi-layer protective coating. The display apparatus 1000 is substantially the same as the display apparatus 900 shown in FIG. 9, other than for the inclusion of a multi-layer protective coating, included herein, on the cover plate 804 and the light blocking layer 812. More particularly, the cover plate 804, and the light blocking layer 812 are coated with a second inner dielectric layer (second IDL) 1002, and a second outer dielectric layer (second ODL) 1003. The display apparatus 1000, similar to the display apparatus 900 of FIG. 9, also includes an inner dielectric layer, first IDL 902, and an outer dielectric layer, first ODL 903, deposited over the shutter assembly 803 and the substrate 806.

The second ODL 1003, which faces the shutter assembly 803, is in direct contact with the fluid 816. Similar to the first ODL 903, the second ODL 1003 has a relatively low density of electrical traps. Therefore, the second ODL 1003 reduces the charge buildup near the cover plate 804 of the display apparatus 1000. In some implementations, the second IDL 1002 and the second ODL 1003 can employ materials, can have similar thicknesses, and can be deposited using deposition techniques, similar to the ones discussed above for the first IDL 902 and first ODL 903 of FIG. 9, respectively. One benefit of employing similar materials and deposition techniques for both the first ODL 903 deposited over the shutter assembly 803 and the second ODL 1003 deposited over the cover plate 804 and the light blocking layer 812 is that even if some charge buildup does occur, such charge buildup will be similar on both these layers. Having similar charge buildup reduces voltage differences and electrostatic forces between the shutter 813 and the cover plate 804 or the light blocking layer 812.

In some implementations, the cover plate 804 may include dielectric layers in addition to the second IDL 1002 and the second ODL 1003. In some implementations, the second IDL 1002 and the second ODL 1003 can include substantially transparent materials such that they can coat the exposed portions of the cover plate 804 defined by the light blocking layer 812 without obstructing light passage through the cover plate 804.

Figure 11:
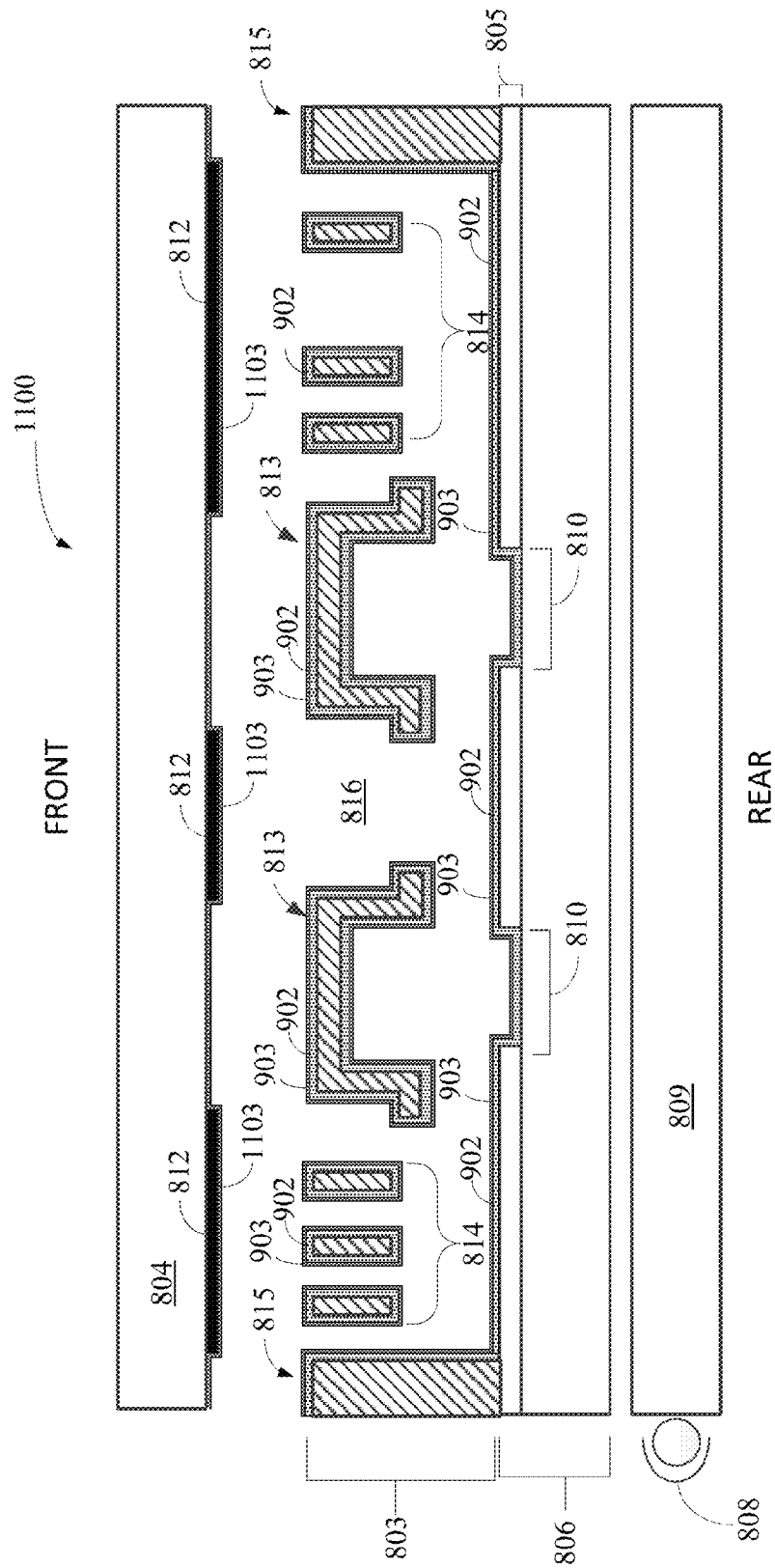
FIG. 11 shows a cross sectional view of a further example display apparatus having a multi-layer protective coating.

FIG. 11 shows a cross sectional view of a further example display apparatus 1100 having a multi-layer protective coating. The display apparatus 1100 is substantially the same as the display apparatus 900 shown in FIG. 9, other than for the inclusion of a single protective coating on the cover plate 804 and the light blocking layer 812. More particularly, the cover plate 804 and the light blocking layer are coated with a third dielectric layer 1103. The third dielectric layer 1103 is in contact with the fluid 816. Unlike the display apparatus 1000 of FIG. 10, the display device 1100 does not include an inner dielectric layer such as second IDL 1002 on the cover plate 804. The third dielectric layer 1103 can employ materials that have similar thicknesses, and can be deposited using techniques, similar to the ones employed for the first ODL 903 and second ODL 1003 of FIGS. 9 and 10, as discussed above. The third dielectric layer 1103 can include substantially transparent materials, and can therefore be deposited over portions of the cover plate 804 that are not covered by light blocking layer 812.

The above discussion of deposition of multiple dielectric layers was described in relation to display apparatus (for example in FIGS. 9-11) having a MEMS-up configuration. As set forth above, in MEMS-up configuration, the shutter assembly is formed on a front surface of a substrate, i.e., the surface that faces toward the viewer. For example, referring to FIG. 9, the shutter assembly 803 is formed and supported (via anchors 815) by a front facing surface of the substrate 806. However, it should be noted that the multiple dielectric deposition techniques discussed above can be equally applied to implementations where the display apparatus is formed in a MEMS-down configuration. As also set forth above, in a MEMS-down configuration, the shutter assembly is formed on a rear facing surface of a front substrate. For example, if the display apparatus 900 of FIG. 9 were to be modified into a MEMS-down configuration, then the shutter assembly 803 would be formed on, and be supported by, the rear facing surface of the cover plate 804. The aperture layer 805 would be disposed between the shutter assembly 803 and the cover plate 804. In such a modified MEMS-down configuration, the two dielectric layers 902 and 903 would be deposited over both shutter assembly 803 the aperture layer 805, and exposed portions of the cover plate 804.

Figure 12:
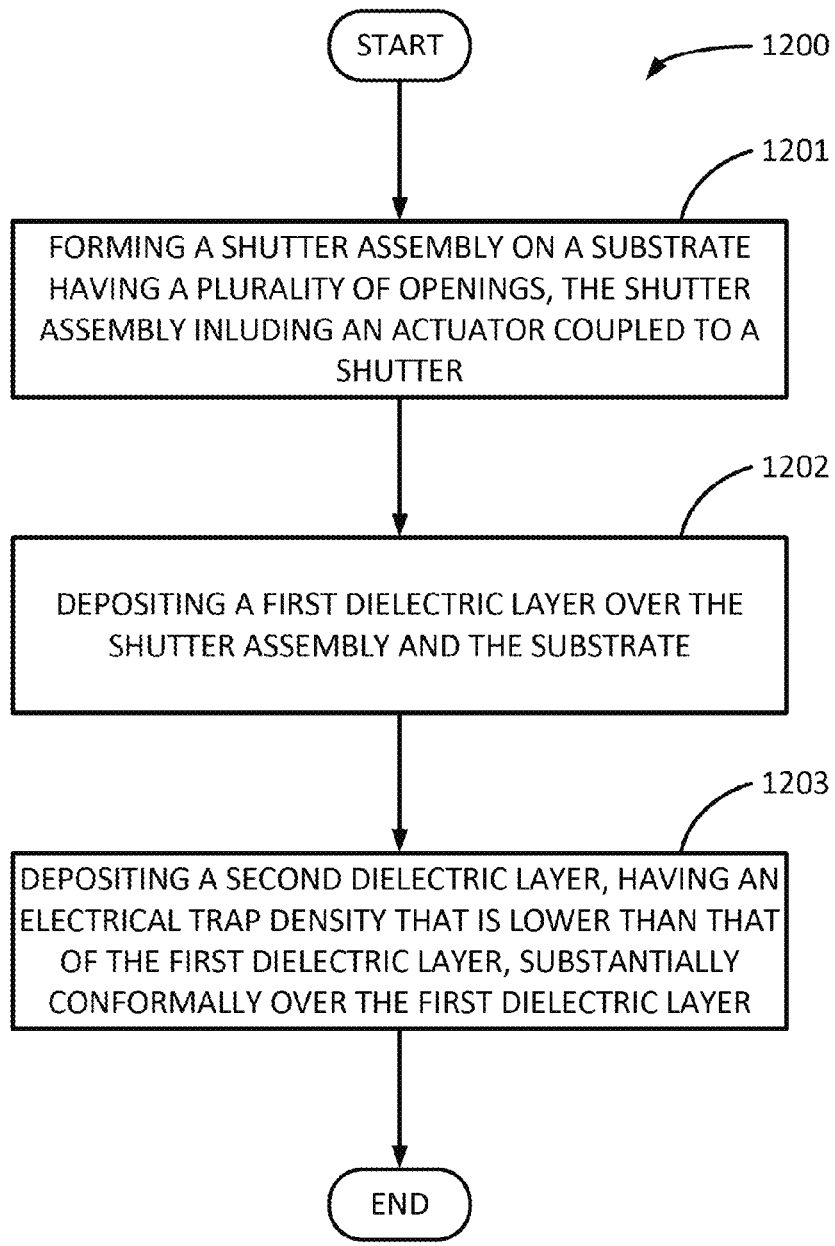
FIG. 12 shows a flow diagram of an example process for providing multiple dielectric layers over one or more portions of the display apparatus.

FIG. 12 shows a flow diagram of an example process for providing multiple dielectric layers over one or more portions of the display apparatus. In particular, the process 1200 includes forming a shutter assembly on a substrate having a plurality of openings where the shutter assembly includes an actuator coupled to a shutter (stage 1201). The process also includes depositing a first dielectric layer over the shutter assembly and the substrate (stage 1202) and depositing a second dielectric layer, having an electrical trap density that is lower than that of the first dielectric layer, substantially conformally over the first dielectric layer (stage 1202). The process 1200 shown in FIG. 12 is discussed further below.

As set forth above, the process 1200 includes forming a shutter assembly over a substrate (stage 1201). Two examples of suitable shutter formation processes are described above in relation to FIGS. 6A-6E and 7A-7D. The final stage in these shutter fabrication processes is a release step, in which the sacrificial mold over which the shutter assembly is formed is removed, thereby releasing the shutter assembly.

Subsequently, the process 1200 includes depositing a first dielectric layer over the shutter assembly and the substrate (stage 1202). The result of this process stage can be seen in FIG. 9, discussed above, in which the first IDL 902 has been deposited over substantially all of the surfaces of the shutter assembly 803 and over the substrate 806. The first IDL 902 also has been deposited over the aperture layer 805 including the apertures 810. As the first IDL 902 is substantially transparent, it can allow light propagating through the apertures 810 to pass through towards the shutters 904 and the front of the display apparatus 900. The deposition of the first IDL 902 can be carried out using deposition techniques such as, without limitation, CVD or PECVD. The first IDL 902 can include materials such as, without limitation, $SiN_x{:}H$, $SiN_x$, $TiO_2$, $HfO_2$, $V_2O_5$, $Nb_2O_5$, or $Ta_2O_5$, SiON, $ZrO_2$, and $La_2O_2$.

Following the deposition of the first dielectric layer, the process 1200 includes depositing a second dielectric layer (stage 1203). This stage was also discussed above in relation to FIG. 9, which shows a second dielectric layer, the first ODL 903, deposited substantially conformally over the first IDL 902. Furthermore, as set forth above, the first ODL 903 has an electrical trap density that is lower than that of the first IDL 902. The deposition of the first ODL 903 can be carried out using deposition techniques such as, without limitation, ALD. The first ODL 903 can include materials such as, without limitation, silicon oxide ($SiO_2$), aluminum oxide ($Al_2O_3$), or $SiN_x$ (with lower electrical trap density than that of the material used for the first IDL 902). The first ODL 903 is also substantially transparent, and can allow light to propagate through the apertures 810.

In some implementations, one or more additional dielectric layers can be deposited over the second dielectric layer (stage 1203). These additional dielectric layers can be deposited to improve the conformality of the deposition or reduce the electrical trap density of the outermost dielectric layer.

In some implementations, depositing the first dielectric layer over the shutter assembly (stage 1202) can be carried out before the shutter assembly is released. This means that the first dielectric layer is deposited while the shutter assembly is still being supported by the sacrificial mold. As the shutter assembly is in contact with the sacrificial mold, only some surfaces of the shutter assembly will be exposed to the deposition of the first dielectric material. The second dielectric material can then be deposited over the first dielectric layer (stage 1203) coating the exposed surfaces of the shutter assembly with a second dielectric layer. After a possible patterning step, the sacrificial mold is removed to release the shutter assembly. The resulting released shutter assembly will have only a subset of the surfaces of the shutter assembly coated with the two dielectric layers. This may increase the risk of charge buildup over the un-coated surfaces. But, depositing the two dielectric layers over the shutter assembly before it is released produces relatively thinner and less stiff actuator beams. Thinner and less stiff beams provide the benefits of reduction in actuation voltage and increase in the speed of operation of the shutter. In some implementations, these benefits may outweigh the possible increase in risks of charge buildup over the un-coated surfaces. In such implementations, the deposition of the first and second dielectric layers can then be carried out prior to releasing the shutter assembly.

Figure 13A:
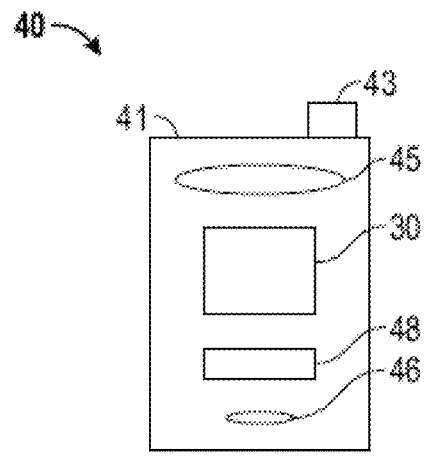
FIGS. 13A and 13B show example system block diagrams illustrating a display device that includes a set of display elements.
Figure 13B:
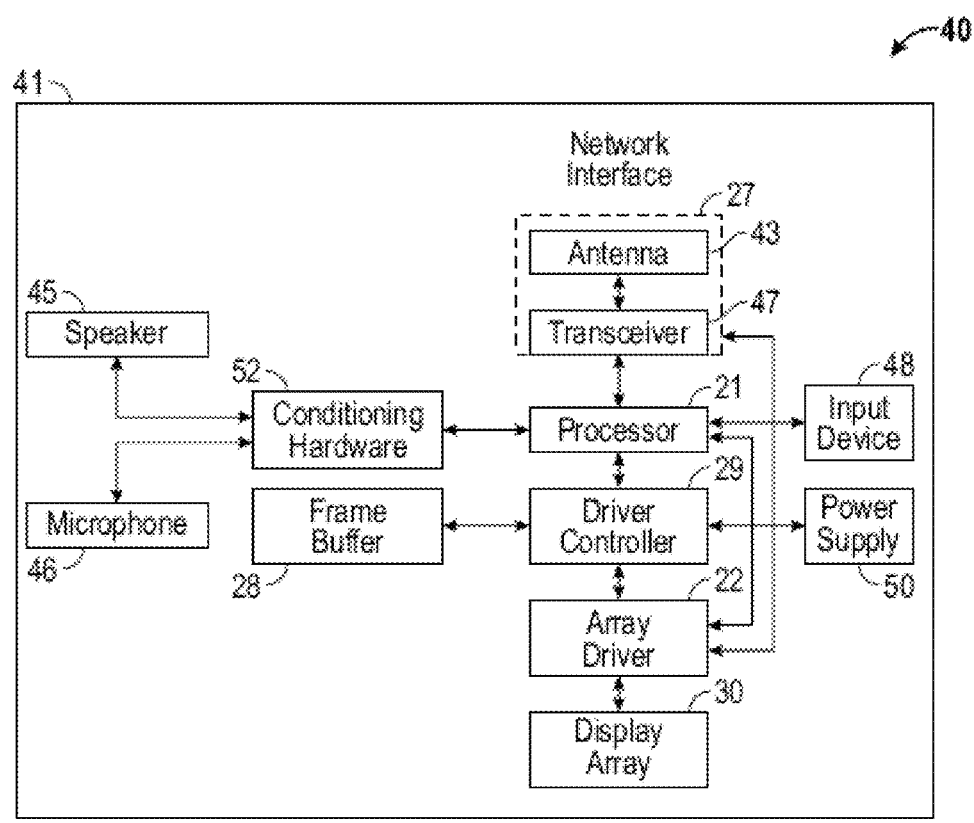

FIGS. 13A and 13B are system block diagrams illustrating a display device 40 that includes a set of display elements. The display device 40 can be, for example, a smart phone, a cellular or mobile telephone. However, the same components of the display device 40 or slight variations thereof are also illustrative of various types of display devices such as televisions, computers, tablets, e-readers, hand-held devices and portable media devices.

The display device 40 includes a housing 41, a display 30, an antenna 43, a speaker 45, an input device 48 and a microphone 46. The housing 41 can be formed from any of a variety of manufacturing processes, including injection molding, and vacuum forming. In addition, the housing 41 may be made from any of a variety of materials, including, but not limited to: plastic, metal, glass, rubber and ceramic, or a combination thereof. The housing 41 can include removable portions (not shown) that may be interchanged with other removable portions of different color, or containing different logos, pictures, or symbols.

The display 30 may be any of a variety of displays, including a bi-stable or analog display, as described herein. The display 30 also can be configured to include a flat-panel display, such as plasma, electroluminescent (EL) displays, OLED, super twisted nematic (STN) display, LCD, or thin-film transistor (TFT) LCD, or a non-flat-panel display, such as a cathode ray tube (CRT) or other tube device. In addition, the display 30 can include a mechanical light modulator-based display, as described herein.

The components of the display device 40 are schematically illustrated in FIG. 13A. The display device 40 includes a housing 41 and can include additional components at least partially enclosed therein. For example, the display device 40 includes a network interface 27 that includes an antenna 43 which can be coupled to a transceiver 47. The network interface 27 may be a source for image data that could be displayed on the display device 40. Accordingly, the network interface 27 is one example of an image source module, but the processor 21 and the input device 48 also may serve as an image source module. The transceiver 47 is connected to a processor 21, which is connected to conditioning hardware 52. The conditioning hardware 52 may be configured to condition a signal (such as filter or otherwise manipulate a signal). The conditioning hardware 52 can be connected to a speaker 45 and a microphone 46. The processor 21 also can be connected to an input device 48 and a driver controller 29. The driver controller 29 can be coupled to a frame buffer 28, and to an array driver 22, which in turn can be coupled to a display array 30. One or more elements in the display device 40, including elements not specifically depicted in FIG. 13A, can be configured to function as a memory device and be configured to communicate with the processor 21. In some implementations, a power supply 50 can provide power to substantially all components in the particular display device 40 design.

The network interface 27 includes the antenna 43 and the transceiver 47 so that the display device 40 can communicate with one or more devices over a network. The network interface 27 also may have some processing capabilities to relieve, for example, data processing requirements of the processor 21. The antenna 43 can transmit and receive signals. In some implementations, the antenna 43 transmits and receives RF signals according to the IEEE 16.11 standard, including IEEE 16.11(a), (b), or (g), or the IEEE 802.11 standard, including IEEE 802.11a, b, g, n, and further implementations thereof. In some other implementations, the antenna 43 transmits and receives RF signals according to the Bluetooth® standard. In the case of a cellular telephone, the antenna 43 can be designed to receive code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1xEV-DO, EV-DO Rev A, EV-DO Rev B, High Speed Packet Access (HSPA), High Speed Downlink Packet Access (HS-DPA), High Speed Uplink Packet Access (HSUPA), Evolved High Speed Packet Access (HSPA+), Long Term Evolution (LTE), AMPS, or other known signals that are used to communicate within a wireless network, such as a system utilizing 3G, 4G or 5G technology. The transceiver 47 can pre-process the signals received from the antenna 43 so that they may be received by and further manipulated by the processor 21. The transceiver 47 also can process signals received from the processor 21 so that they may be transmitted from the display device 40 via the antenna 43.

In some implementations, the transceiver 47 can be replaced by a receiver. In addition, in some implementations, the network interface 27 can be replaced by an image source, which can store or generate image data to be sent to the processor 21. The processor 21 can control the overall operation of the display device 40. The processor 21 receives data, such as compressed image data from the network interface 27 or an image source, and processes the data into raw image data or into a format that can be readily processed into raw image data. The processor 21 can send the processed data to the driver controller 29 or to the frame buffer 28 for storage. Raw data typically refers to the information that identifies the image characteristics at each location within an image. For example, such image characteristics can include color, saturation and gray-scale level.

The processor 21 can include a microcontroller, CPU, or logic unit to control operation of the display device 40. The conditioning hardware 52 may include amplifiers and filters for transmitting signals to the speaker 45, and for receiving signals from the microphone 46. The conditioning hardware 52 may be discrete components within the display device 40, or may be incorporated within the processor 21 or other components.

The driver controller 29 can take the raw image data generated by the processor 21 either directly from the processor 21 or from the frame buffer 28 and can re-format the raw image data appropriately for high speed transmission to the array driver 22. In some implementations, the driver controller 29 can re-format the raw image data into a data flow having a raster-like format, such that it has a time order suitable for scanning across the display array 30. Then the driver controller 29 sends the formatted information to the array driver 22. Although a driver controller 29, such as an LCD controller, is often associated with the system processor 21 as a stand-alone Integrated Circuit (IC), such controllers may be implemented in many ways. For example, controllers may be embedded in the processor 21 as hardware, embedded in the processor 21 as software, or fully integrated in hardware with the array driver 22.

The array driver 22 can receive the formatted information from the driver controller 29 and can re-format the video data into a parallel set of waveforms that are applied many times per second to the hundreds, and sometimes thousands (or more), of leads coming from the display's x-y matrix of display elements.

In some implementations, the driver controller 29, the array driver 22, and the display array 30 are appropriate for any of the types of displays described herein. For example, the driver controller 29 can be a conventional display controller or a bi-stable display controller. Additionally, the array driver 22 can be a conventional driver or a bi-stable display driver. Moreover, the display array 30 can be a conventional display array or a bi-stable display array. In some implementations, the driver controller 29 can be integrated with the array driver 22. Such an implementation can be useful in highly integrated systems, for example, mobile phones, portable-electronic devices, watches or small-area displays.

In some implementations, the input device 48 can be configured to allow, for example, a user to control the operation of the display device 40. The input device 48 can include a keypad, such as a QWERTY keyboard or a telephone keypad, a button, a switch, a rocker, a touch-sensitive screen, a touch-sensitive screen integrated with the display array 30, or a pressure- or heat-sensitive membrane. The microphone 46 can be configured as an input device for the display device 40. In some implementations, voice commands through the microphone 46 can be used for controlling operations of the display device 40.

The power supply 50 can include a variety of energy storage devices. For example, the power supply 50 can be a rechargeable battery, such as a nickel-cadmium battery or a lithium-ion battery. In implementations using a rechargeable battery, the rechargeable battery may be chargeable using power coming from, for example, a wall socket or a photovoltaic device or array. Alternatively, the rechargeable battery can be wirelessly chargeable. The power supply 50 also can be a renewable energy source, a capacitor, or a solar cell, including a plastic solar cell or solar-cell paint. The power supply 50 also can be configured to receive power from a wall outlet.

In some implementations, control programmability resides in the driver controller 29 which can be located in several places in the electronic display system. In some other implementations, control programmability resides in the array driver 22. The above-described optimization may be implemented in any number of hardware and/or software components and in various configurations.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, e.g., a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

If implemented in software, the functions may be stored on or transmitted over as one or more instructions or code on a computer-readable medium. The processes of a method or algorithm disclosed herein may be implemented in a processor-executable software module which may reside on a computer-readable medium. Computer-readable media includes both computer storage media and communication media including any medium that can be enabled to transfer a computer program from one place to another. A storage media may be any available media that may be accessed by a computer. By way of example, and not limitation, such computer-readable media may include RAM, ROM, EEPROM, CD-ROM or other optical disk storage, magnetic disk storage or other magnetic storage devices, or any other medium that may be used to store desired program code in the form of instructions or data structures and that may be accessed by a computer. Also, any connection can be properly termed a computer-readable medium. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and instructions on a machine readable medium and computer-readable medium, which may be incorporated into a computer program product.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of any device as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

The invention claimed is:

1. An apparatus, comprising:
a light blocking layer, defining a plurality of openings for passing light, disposed on a substrate;
at least one light modulator, responsive to image data, configured to modulate light propagating through at least one of the plurality of openings;
a first dielectric layer disposed over at least a portion of the light blocking layer and over surfaces of the at least one light modulator that are substantially parallel to the substrate and over surfaces of the at least one light modulator that are substantially normal to the substrate; and
a second dielectric layer, having an electrical trap density that is lower than that of the first dielectric layer, disposed directly and substantially conformally over the first dielectric layer.

2. The apparatus of claim 1, wherein the first dielectric layer is thicker than the second dielectric layer.

3. The apparatus of claim 1, wherein the first dielectric layer includes a chemical vapor-deposited material and the second dielectric layer includes an atomic layer-deposited material.

4. The apparatus of claim 1, further comprising a fluid in which the at least one light modulator is immersed, such that the fluid is in contact with the second dielectric layer.

5. The apparatus of claim 1, further comprising a cover plate for transmitting a modulated light received from at least one light modulator to a front side of the apparatus, wherein the second dielectric layer is additionally disposed over a portion of the cover plate facing the at least one light modulator.

6. The apparatus of claim 1, further comprising a cover plate for transmitting a modulated light received from at least one light modulator to a front side of the apparatus, wherein the first dielectric layer and the second dielectric layer are disposed over a portion of the cover plate facing the at least one light modulator.

7. The apparatus of claim 1, wherein a thickness of the first dielectric layer is within a range of about 10 nm to about 300 nm.

8. The apparatus of claim 1, wherein a thickness of the second dielectric layer is within a range of about 1 nm to about 100 nm.

9. The apparatus of claim 1, further comprising:
a display including:
the light blocking layer and the at least one light modulator;
a processor that is configured to communicate with the display, the processor being configured to process image data; and
a memory device that is configured to communicate with the processor.

10. The apparatus of claim 9, the display further including:
a driver circuit configured to send at least one signal to the display; and
a controller configured to send at least a portion of the image data to the driver circuit.

11. The apparatus of claim 9, the display further including:
an image source module configured to send the image data to the processor, wherein the image source module comprises at least one of a receiver, transceiver, and transmitter.

12. The apparatus of claim 9, the display further including:
an input device configured to receive input data and to communicate the input data to the processor.

13. A method for forming a shutter assembly, comprising:
forming a shutter assembly on a substrate, the shutter assembly including a shutter and an actuator coupled to the shutter;
depositing a first dielectric layer over the shutter assembly and the substrate; and
depositing a second dielectric layer, having an electrical trap density that is lower that that of the first dielectric layer, substantially conformally over the first dielectric layer.

14. The method of claim 13, wherein depositing the first dielectric layer includes depositing the first dielectric layer over surfaces of the shutter assembly that are substantially parallel to the substrate and over surfaces of the shutter assembly that are substantially normal to the substrate.

15. The method of claim 13, further comprising: depositing the first dielectric layer to a first thickness and depositing the second dielectric layer to a second thickness, wherein the first thickness is greater than the second thickness.

16. The method of claim 13, further comprising: immersing the shutter assembly in a fluid, such that the fluid is in contact with the second dielectric layer.

17. The method of claim 13, wherein depositing the first dielectric layer includes forming a thickness of the first dielectric layer within a range of about 10 nm to about 300 nm.

18. The method of claim 13, wherein depositing the second dielectric layer includes forming a thickness of the second dielectric layer within a range of about 1 nm to about 100 nm.

19. The method of claim 13, wherein depositing the first dielectric layer includes employing a chemical vapor deposition technique for depositing the first dielectric layer.

20. The method of claim 13, wherein depositing the second dielectric layer includes employing an atomic layer deposition technique for depositing the second dielectric layer.

21. The method of claim 13, further comprising: providing a cover plate configured for transmitting a modulated light allowed to pass by the shutter to a front of a display apparatus, and depositing the first dielectric layer over a portion of the cover plate configured to face the shutter assembly.

22. The method of claim 21, further comprising: depositing the second dielectric layer over the first dielectric layer that is deposited over the portion of the cover plate facing the shutter assembly.

23. The method of claim 13, wherein forming the shutter assembly includes:
    forming a mold on the substrate;
    forming the shutter assembly over the mold; and
    removing the mold to release the shutter assembly.

24. The method of claim 23, further comprising: depositing the first dielectric material and depositing the second dielectric material prior to removing the mold.

25. The method of claim 23, further comprising: depositing the first dielectric material and depositing the second dielectric material after removing the mold.

26. A display apparatus, comprising:
    light blocking means, disposed on a substrate, for defining a plurality of openings for passing light;
    light modulating means, responsive to image data, for modulating light propagating through at least one of the plurality of openings;
    first dielectric means disposed over at least a portion of the light blocking means and over surfaces of the light modulating means for providing a first layer of insulation; and
    second dielectric means disposed substantially conformally over the first dielectric means for providing a second layer of insulation, wherein an electric trap density of the second dielectric means is less than that of the first dielectric means.

27. The display device of claim 26, wherein the second dielectric means is thicker than the first dielectric means.

28. The display device of claim 26, further comprising: lubricating means for facilitating movement of the light modulating means, wherein the lubricating means is in contact with the second dielectric means.

29. The display device of claim 26, further comprising: covering means for passing modulated light received from the light modulator means, wherein the second dielectric means is additionally disposed over a portion of the covering means facing the light modulating means.

* * * * *